US008755469B1

(12) United States Patent
Su

(10) Patent No.: US 8,755,469 B1
(45) Date of Patent: Jun. 17, 2014

(54) METHOD OF SPECTRUM MAPPING AND EXPLOITATION USING DISTRIBUTED SENSORS

(75) Inventor: Wei Su, Bel Air, MD (US)

(73) Assignee: The United States of America, as represented by the Secretary of the Army, Washington, DC (US)

( * ) Notice: Subject to any disclaimer, the term of this patent is extended or adjusted under 35 U.S.C. 154(b) by 143 days.

(21) Appl. No.: 13/589,735

(22) Filed: Aug. 20, 2012

Related U.S. Application Data

(63) Continuation-in-part of application No. 13/325,124, filed on Dec. 14, 2011, now Pat. No. 8,295,409, which is a continuation-in-part of application No. 12/148,076, filed on Apr. 15, 2008, now Pat. No. 8,085,882.

(51) Int. Cl.
*H03D 1/00* (2006.01)
*H04L 27/06* (2006.01)

(52) U.S. Cl.
USPC ............ 375/340; 375/342; 375/343; 375/262

(58) Field of Classification Search
USPC .................................. 375/340, 342, 343, 262
See application file for complete search history.

(56) References Cited

U.S. PATENT DOCUMENTS

| 7,496,482 B2 * | 2/2009 | Araki et al. .................... 702/190 |
| 2008/0129475 A1 * | 6/2008 | Breed et al. .................... 340/438 |

\* cited by examiner

*Primary Examiner* — Qutbuddin Ghulamali
(74) *Attorney, Agent, or Firm* — Azza Jayaprakash

(57) ABSTRACT

A method for operating a distributed multi-sensor system for spectrum mapping and signal exploitation. The method includes selecting a plurality of distributed sensors including at least one or more clusters of distributed sensors, sending a request to the plurality of distributed sensors to collect signal snapshot copies, routing the signal snapshot copies or information from the plurality of distributed sensors as inputs to at least one fusion module, processing all inputs before sending any next request to the plurality of distributed sensors, optimizing the one or more clusters of distributed sensors, combining multiple distributed signal inputs in the at least one fusion module, and making a global decision. A system for spectrum mapping and signal exploitation and a storage medium encoded with machine-readable computer code for implementing the method are also disclosed.

20 Claims, 20 Drawing Sheets

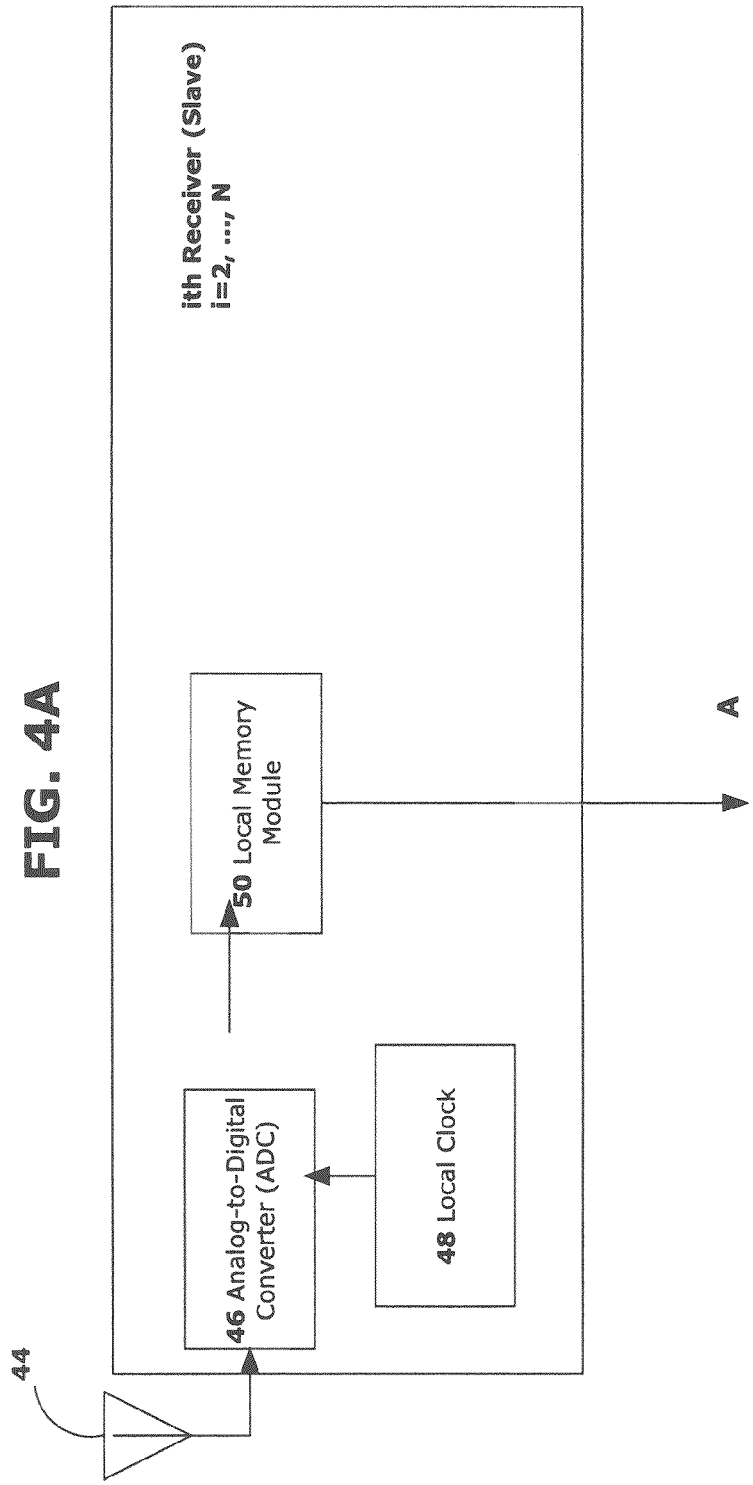

METHOD OF SPECTRUM MAPPING AND EXPLOITATION USING DISTRIBUTED SENSORS

CROSS-REFERENCE TO RELATED APPLICATIONS

This application is a Continuation-In-Part of U.S. patent application Ser. No. 13/325,124, which was filed on Dec. 14, 2011, and which is a continuation of U.S. patent application Ser. No. 12/148,076, which was filed on Apr. 15, 2008, and this Continuation-in-Part is being filed under 35 U.S.C. Section 120, and priority from those earlier applications is hereby claimed, and those earlier applications are incorporated herein by reference in their entirety.

GOVERNMENT INTEREST

The invention described herein may be manufactured, used, imported, sold, and licensed by or for the Government of the United States of America without the payment to me of any royalty thereon.

FIELD OF THE INVENTION

The present invention generally relates to a method and a system of signal collection networks. In particular, the present invention concerns a method and a system for spectrum mapping and exploitation using distributed sensors together with multi-sensor fusion.

BACKGROUND OF THE INVENTION

Non-cooperative demodulation is a technique to demodulate communication signals without hand shaking between the transmitter and the receiver. This technique has been widely used in both military and commercial communications, battlefield surveillance, hostile signal detection, and signal monitoring. In non-cooperative communications, the receiver has no knowledge, or only has limited knowledge of the transmitting signal, for example the signal monitoring devices may not know the format of the signal being monitored in tactical or hostile environment involving military or law enforcement operations. Non-cooperative demodulation will be used in non-cooperative communication.

Automatic modulation classification is a key component in non-cooperative demodulation for recognizing the modulation scheme of a transmitted signal without prior knowledge of the signal ground truth and cueing the software-defined radio to choose the proper built-in demodulator. Although significant research has been conducted on automatic modulation classification methods during the last two decades, this research has been limited to single receiver situations where the classification performance and recognition of a successful rate have largely depended on channel quality and the receiver signal strength. These conditions do not ordinarily apply to non-cooperative communications because in a non-cooperative communication environment, particularly in military applications, the received signal at the single sensor is usually very weak so that the single sensor modulation classification of an unknown weak signal is usually difficult and unreliable.

Further, prior art automatic modulation classification devices and methods do not adequately account for multiple receiver situations such as sensor networks, whose uses have become more and more popular. Due to the dramatic and widespread use of sensor networks, single sensor monitoring is now considered to be inadequate.

Thus, there has been a long-felt need for better signal monitoring techniques that lead to more effective modulation classification of weak signals without suffering from the limitations, shortcomings and difficulties of single receiver configurations such as receiving weak signals and classifying the unknown weak signal.

The general principles of SDRs and modulation classifications or schemes are presented in the following publications which are incorporated herein in their entirety: Y. Huang and A. Polydoros, Likelihood methods for MPSK modulation classification. IEEE Trans. Commun., vol. 43, 1493-1504; J. Sills, Maximum-likelihood modulation classification for PSK/QAM. Proc. MILCOM'99, 1999, 57-61; K. Umebayshi et al., "Blind estimation of the modulation scheme adapted to noise power based on a concept of software define radio," in Proc. in European Wireless 2002(EW2002), pp.829-834 (2002-02); O. Menguc and F. Jondral, "Air interface recognition for a software radio system exploiting cyclostationarity," in Proc. of the 15th IEEE Personal, Indoor and Mobile Radio Communications, Vol. 3, September 2004, pp.1947-1951.

Automatic modulation classification methods are also discussed in "Real-time Modulation Classification Based on Maximum Likelihood," by Wei Su, Jefferson L. Xu and Mengchu Zhou. This publication was presented to the IEEE in about November 2008 and is incorporated herein in its entirety. Further discussion of software-defined radio and modulation recognition is presented in "Software Defined Radio Equipped with Rapid Modulation Recognition" by Wei Su, *Senior Member, IEEE*, Jefferson L. Xu and Mengchu Zhou, *Fellow, IEEE*, which is also incorporated herein in its entirety. The latter publication was also presented to the IEEE in about October 2009.

SUMMARY OF THE INVENTION

In order to meet the long-felt need for more effective signal monitoring and improved demodulation, without suffering from the limitations, shortcomings and difficulties of prior art configurations, this invention's multi-sensor signal fusion devices and methods combine signals from multiple sensors to provide descriptions of the monitored signals that are more accurate than single signal demodulation. Multi-sensor signal fusion offers increased reliability and huge gains in overall performance compared to the single-sensor demodulation so that the automatic modulation classification of weak signals in non-cooperative communication environment could be stronger and more reliable. This invention's multi-sensor signal fusion devices also take advantage of the latest techniques for improving geo-location accuracy and eliminating the channel distortion of the transmitted signals.

Thus, it is an object of the present invention to provide a multi-sensor signal fusion apparatus for automatic modulation classification of an unknown signal.

Another object of the present invention is to provide a multi-sensor signal fusion apparatus for automatic modulation classification that provides a more accurate description of an unknown signal.

It is a further object of the present invention to provide a multi-sensor signal fusion apparatus for automatic modulation classification of weak signals in a non-cooperative communication environment that provides a more accurate description of an unknown signal.

These and other objects and advantages can now be attained by this invention's multi-sensor non-cooperative demodulation device comprising a group of sensors, a signal fusion sensor, a means for signal demodulation, and a means for automatic modulation classification. An output of the signal fusion sensor is sent to a means for modulation scheme classification to select the appropriate demodulation technique for demodulating the unknown signal to provide the necessary intelligence about the monitored signals to the user. This invention's multi-sensor non-cooperative demodulation device, system and methods provide more accurate descriptions of monitored signals in a non-cooperative environment without suffering from the disadvantages, shortcomings and limitations of prior art techniques and devices.

The present invention also contemplates a multi-sensor signal fusion article of manufacture with a storage medium encoded with machine-readable computer program code for more accurate descriptions of monitored signals and methods for achieving higher accuracy descriptions of monitored signals in a non-cooperative environment with multi-sensor non-cooperative demodulation.

The present invention covers a broad application and includes homogeneous and heterogeneous sensors, hard and soft decision fusions, and synchronous and asynchronous signal fusions for spectrum mapping and exploitation.

The present invention is directed to a distributed multi-sensor system for spectrum mapping and signal exploitation, comprising a plurality of distributed sensors comprising a first set of sensors distributed in a first region and the first set of sensors configured to receive a plurality of non-cooperative non coherent and asynchronous signals, s(t), from an unknown transmission source of interest (SOI), each of the sensors of the first set having a sampling clock and a local memory, and providing a first set of received signals, and the plurality of distributed sensors further comprising a second set of sensors including a cluster of sensors distributed in a second region and the second set of sensors configured to receive a plurality of non-cooperative non coherent and asynchronous signals, s(t), from an unknown transmission source of interest (SOI), each of the sensors of the second set having a sampling clock and a local memory, and providing a plurality of received signals; the plurality of sensors being configured to collect timestamped data snapshots of the SOI; a first fusion center disposed in the first region and being configured to receive timestamped signals from the first set of sensors; a second fusion center disposed outside of the first region of distributed sensors and the second region of distributed sensors and being configured to receive timestamped signals from the second set of sensors and at least one of signals and information from the first fusion center; the second fusion center configured to process all signal inputs before sending any next request to the plurality of sensors and to optimize the plurality of sensors; the second fusion center also being configured to combine the distributed signal inputs from the plurality of sensors; the second fusion center including means for making a global decision concerning the sensor signals.

In one preferred embodiment, the distributed multi-sensor system comprises a signal exploitation unit (SEU) for spectrum mapping and exploitation and means for sending the global decision as output from the second fusion module to the SEU. The distributed multi-sensor system further comprising means disposed in the second fusion center for localizing the combined multiple distributed signal inputs before making a global decision. Preferably, the distributed multi-sensor system further comprises means disposed in the second fusion center for classifying the combined multiple distributed signal inputs before making a global decision. Also a means disposed in the second fusion center provides for at least one of coarse channel analysis, coarse signal classification and coarse emitter localization before optimizing the plurality of distributed sensors.

In another embodiment, the distributed multi-sensor system includes a data storage module coupled to the second fusion module for storing results obtained by the second fusion module. Preferably, the plurality of distributed sensors comprises at least one of thin sensors and thick sensors. The fusion centers provide at least one of hard and soft decisions. The data storage module can also be coupled to the SEU and to the distributed sensors for storing information from the SEU and from the distributed sensors.

The present invention is also directed to a method for operating a distributed multi-sensor system for spectrum mapping and signal exploitation, comprising selecting a plurality of distributed sensors including at least one or more clusters of distributed sensors; sending a request to the plurality of distributed sensors to collect signal snapshot copies; routing signal snapshot copies or information from the plurality of distributed sensors as inputs to at least one fusion module; processing all inputs before sending any next request to the plurality of distributed sensors; optimizing the one or more clusters of distributed sensors; combining multiple distributed signal inputs in the at least one fusion module; and making a global decision.

In an alternative preferred embodiment, the method further comprises sending the global decision as output from the at least one fusion module to a signal exploitation unit (SEU) for spectrum mapping and exploitation. The method can also comprise classifying the combined multiple distributed signal inputs before making a global decision as well as localizing the combined multiple distributed signal inputs before making a global decision. In addition, the method can include providing at least one of coarse channel analysis, coarse signal classification and coarse emitter localization before optimizing the one or more clusters of distributed sensors.

In yet another embodiment, the method includes providing a data storage module and coupling the data storage module to the at least one fusion module for storing results obtained by the at least one fusion module. The data storage module can also be coupled to the data storage module to the SEU for storing information from the SEU. Preferably the data storage module can also be coupled to the plurality of distributed sensors for storing information from the plurality of distributed sensors.

A storage medium encoded with machine-readable computer code is also provided for a distributed multi-sensor system for spectrum mapping and signal exploitation for implementing the method according to the present invention. The encoded storage medium can preferably be disposed in at least one of the plurality of distributed sensors and the at least one fusion module.

BRIEF DESCRIPTION OF THE DRAWINGS

FIG. 4A is a first part of a conceptual block illustrating multi-sensor fusion with master and slave sensors in accordance with the present invention;

DETAILED DESCRIPTION OF THE INVENTION

Figure 1:
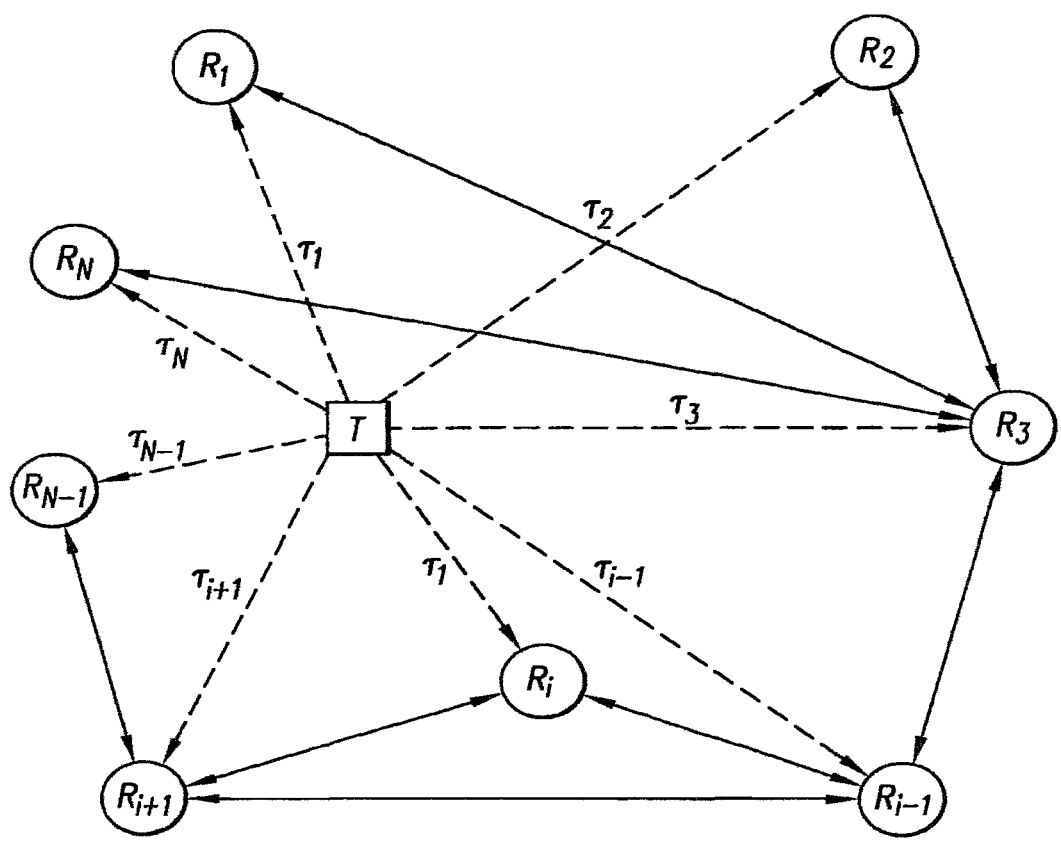
FIG. 1 is a diagram illustrating a typical communication sensor network.

In accordance with the present invention, fusing multiple signals in connection with non-cooperative demodulation affords a more effective demodulation without suffering from the limitations, shortcomings, and difficulties of single receiver configurations, such as receiving weak signals and classifying the unknown weak signal. FIG. 1 is a diagram illustrating a typical communication sensor network with an unknown transmitter T and N number of communication sensors, denoted by $R_1, R_2, \ldots,$ and $R_N$. The unknown transmitted signal is transmitted by a transmitter T and is collected by sensors $R_1, R_2, \ldots,$ and $R_N$ non-cooperatively. In this diagram, the sensors can communicate with each other cooperatively, but they do not need to be fully connected. The sensors have no hand-shaking with the unknown transmitter, T.

Figure 2:
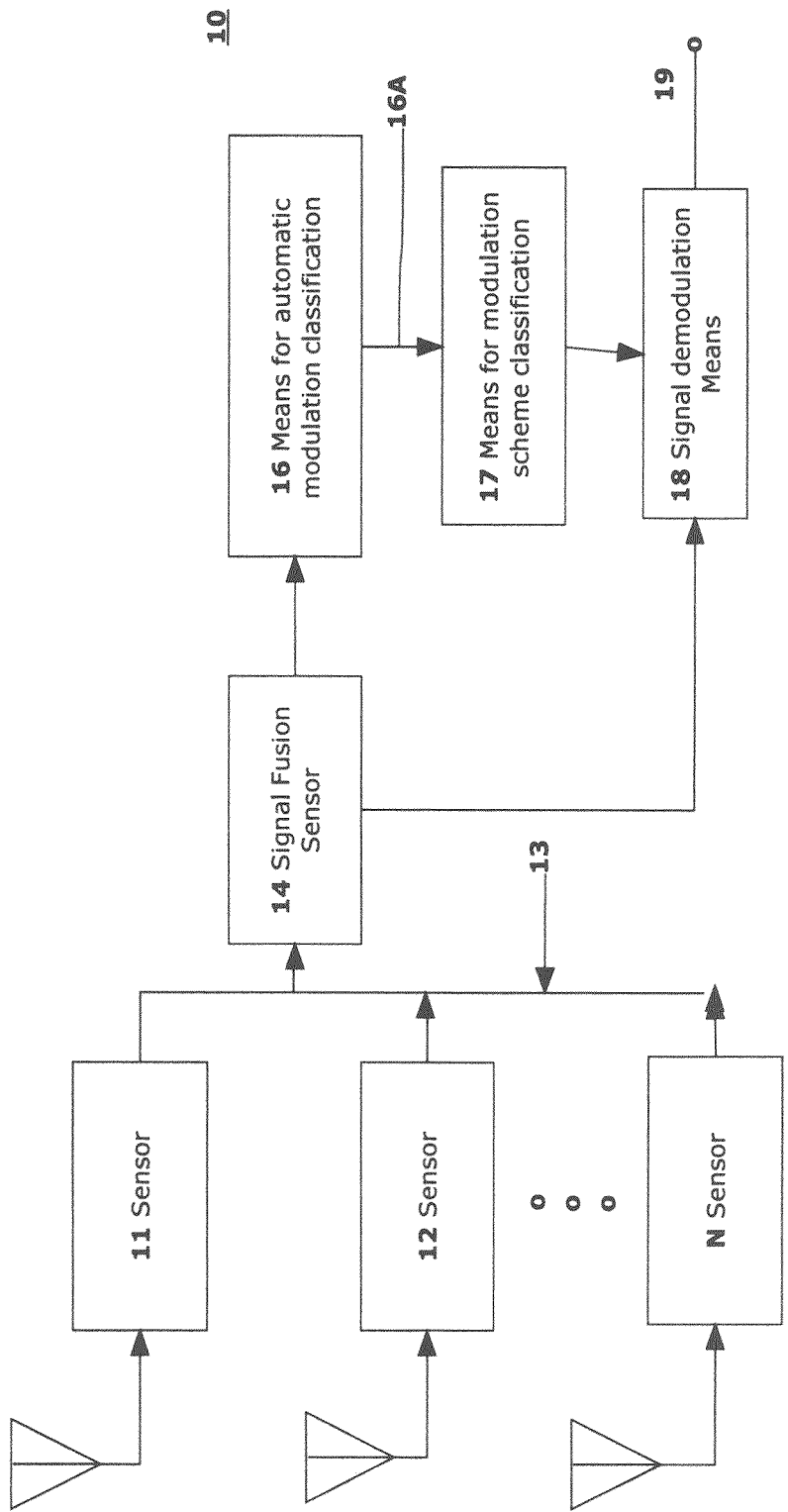
FIG. 2 is a conceptual block diagram depicting a simplified version of the multi-sensor non-cooperative demodulation device in accordance with the present invention.

FIG. 2 is a conceptual block diagram depicting a simplified version of the multi-sensor non-cooperative demodulation device 10, comprising a group of sensors, a signal fusion sensor, a means for signal demodulation that generates a demodulated signal, and a means for automatic modulation classification to estimate a modulation scheme. Referring now to FIG. 2, multiple sensors 11, 12, and N receive non-cooperative signals, from an unknown transmission source. The sensors 11, 12 and N, each have a sampling clock to digitize the received signals and a local memory to store the received signals, $r_{0i}$, 13 in the form of signal packets. Denoting the unknown signal as s(t), the received signal, $r_{0i}$, 13, at the $i^{th}$ sensor is described by the following expression:

$$r_{0i}(t) = a_{0i}(t)s(t-\tau_i) + n_{0i}(t) + I_{0i}(t) \quad \text{Equation (1)}$$

where $a_{0i}(t)$ is the channel attenuation between the transmitter T and receiver $R_i$, $n_{0i}(t)$ is the additive noise with a zero mean between the transmitter T and receiver $R_i$, and $I_{0i}(t)$ is a combination of random interferences between the transmitter T and receiver $R_i$. The received signals 13 are combined in a signal fusion sensor 14 that extracts the weak signals and generates a combined, or fused, digitized signal 15. The received signal at the first sensor 11 digitizes a short time duration, or fragment, of the received signal $r_{0i}(t)$ to K samples, which are time-stamped and stored in the local memory as a packet. Let $t=kT_s$, in EQ. 1, the digitized signal at the first receiving sensor 11 can approximately be described by:

$$r_{01}(kT_s) = a_{01}(kT_s)s((k-m_1)T_s - \delta_{01}) + n_{01}(kT_s) + I_{01}(kT_s) \quad \text{Equation (2)}$$

where $k=1, 2, \ldots, K$, $T_s$ is the sampling time-period, $m_{01}$ is a positive integer contributed by the transmission time-delay, and $\delta_{01}$ is a decimal number between $-0.5\ T_s$ and $0.5\ T_s$ related to the reminder of $\tau_i/T_s$. The digitized received signals from all sensors, 11, 12, and N are combined at the signal fusion sensor 14 to form the combined digitized signal 15 which is sent to a means for automatic modulation classification 16 to estimate a modulation scheme that simulates the modulation of the unknown signals, s(t).

An output estimate 16A is sent to a means for modulation scheme classification 17 that selects the appropriate demodulation technique for demodulating the unknown signals, s(t), such as PSK8, FSK2 and QAM16. The signal demodulation means 18 classifies the unknown signals, s(t), and provides a demodulated signal 19 with improved fidelity and reliability allowing the user to better conduct hostile signal detection, surveillance, and monitoring.

This invention's multi-sensor demodulation device 10 eliminates signal variables such as the power of the channel noise, disturbances and combined interference by taking advantage of the spatial diversity and randomness of those unknown terms and digitizing a fragment of the received signal $r_{0i}(t)$ to K samples. The resolution of the combined digitized signal 15 depends upon the sampling rate. Since the sampling clocks at the receiving sensors 11, 12 and N are asynchronous and jittering in a given time frame, the digitized receiving signals $r_{0i}(kT_s)$ have a small time offset referencing to the first receiving sensor 11. It is reasonable to assume the sampling time-period $T_s$ is fixed within the analysis time frame, the signal $r_{0i}(kT_s)$ can be described by $$r_{0i}(kT_s - d_{0i}) = a_{0i}(kT_s - d_{0i})s((k - m_i)T_s - \delta_{0i}) + n_{0i}(kT_s - d_{0i}) + I_{0i}(kT_s - d_{0i}) \quad \text{Equation (3)}$$

where $d_{0i}$ is the time-synchronization offset, $\delta_{0i}$ is a decimal number between $-0.5\ T_s$ and $0.5\ T_s$, which is a remainder related to time-quantization, time-synchronization, and time-jittering. Note that $m_i$ and $\delta_{0i}$ in (3) have been adjusted for the effect of $d_{0i}$. Since the communication between T and $R_i$ is non-cooperative, the channel equalization and signal recovery at each single sensor is very difficult.

For simplification, denoting $$r_{0i}(k) = r_{0i}(kT_s - d_{0i}),\ a_{0i}(k) = a_{0i}(kT_s - d_{0i}),\ n_{0i}(k) = n_{0i}(kT_s - d_{0i}),\ \text{and}$$

$$I_{0i}(k) = I_{0i}(kT_s - d_{0i})$$

and combining EQ. 2 and EQ. 3 results in the expression:

$$r_{0i}(k) = a_{0i}(k)s((k - m_i)T_s - \delta_{0i}) + n_{0i}(k) + I_{0i}(k) \quad \text{Equation (4)}$$

where $i=1, 2, \ldots, N_s$. In this simplified embodiment, the first receiving sensor, $R_1$, or 11, functions as a master and all other sensors: $R_2, R_3, \ldots, R_N$ (12 and N) function as slaves passing the received signal packets from the local memories to the master in various relay routes for data fusion. The communications between the master and slaves can be wired or wireless.

The cooperation between the master and slaves is a critical element of the signal fusion aspect of the present invention. The signal transmission from slaves to the master is asynchronous in time since all data fragments are sent as packets. Furthermore, when the communications among sensors are cooperative, the channel distortion to the data transmission can be compensated and the data can be recovered reliably by using various existing techniques such as error coding, interleaving, and equalization. The received packet at the master contains K signal samples, which are described by:

$$r_i(k) = a_{i1}(k)r_{0i}(k) + n_{i1}(k) + I_{i1}(k)$$

$$r_i(k) = a_{i1}(k)r_{0i}(k) + n_{i1}(k) + I_{i1}(k) \quad \text{Equation (5)}$$
$$= a_i(k)s((k - m_i)T_s) + \Delta s_i(k) + n_i(k) + I_i(k)$$

where $k=1, 2, \ldots, N$, $a_i(k)=a_{i1}(k)a_{0i}(k)$, $n_i(k)=n_{0i}(kT_s-d_{0i})+n_{i1}(k)$, $I_i(k)=I_{0i}(kT_s-d_{0i})+I_{i1}(k)$, $n_{i1}(k)$ is the additive channel noise between the $i^{th}$ slave and the master with $n_{1,1}(k)=0$, and $I_{i1}(i)$ represents the random combined disturbances between the $i^{th}$ slave and the master with. The following term describes the signal distortion due to digitization:

$$\Delta s_i(k) = a_{i1}(k)a_{0i}(k)s((k - m_i)T_s - \delta_{0i}) - a_i(k)s((k - m_i)T_s) \quad \text{Equation (6)}$$

After the master takes all packets from the memories of $R_2$, $R_3, \ldots, R_N$, the signal samples are aligned and combined into a single signal. Various methods can be used in aligning and combining signals. One way is to shift the waveform with an estimated delay of $\hat{m}_i$, $i=2, \ldots, N$, and $\hat{m}_i=0$, and calculate the expectation of all shifted signals as described by these equations:

$$y(k) = \frac{1}{N-1} \sum_{i=1}^{N} r_i(k + \hat{m}_i) \approx \quad \text{Equation (7)}$$

$$\left(\frac{1}{N-1} \sum_{i=1}^{N} a_i(k)\right) s(kT_s) + \frac{1}{N-1} \sum_{i=1}^{N} \Delta s_i(k + \hat{m}_i) +$$

$$\frac{1}{N-1} \sum_{i=1}^{N} n_i(k + \hat{m}_i) + \frac{1}{N-1} \sum_{i=1}^{N} I_i(k + \hat{m}_i) =$$

$$A(k)s(kT_s) + \Delta S(k) + L(k) + I(k)$$

where $$A(k) = \frac{1}{N-1} \sum_{i=1}^{N} a_i(k),\ \Delta S(k) = \frac{1}{N-1} \sum_{i=1}^{N} \Delta s_i(k + \hat{m}_i),$$

$$L(k) = \frac{1}{N-1} \sum_{i=1}^{N} n_i(k + \hat{m}_i),$$

and $$I(k) = \frac{1}{N-1} \sum_{i=1}^{N} I_i(k + \hat{m}_i).$$

The estimation of $\hat{m}_i$, $i=2, \ldots, N$, depends on the over-sampling rate. A high over-sampling rate give a more accurate delay value of $\hat{m}_i$. When the over-sampling rate is low, interpolation and re-sampling can be advantageously used to improve the accuracy of $\hat{m}_i$. It is noted that the terms $\Delta s_i(k)$, $n_i(k)$, and $I_i(k)$ are eliminated by taking averages. If all of those terms have zero means, and $A(k)$ approaches a constant number A, we have $\Delta S(k)+L(k)+I(k) \to 0$ and $A(k) \to A$ when the number of receiving sensors 11, 12 and N is large, that is $N \to \infty$. This yields the following expression:

$$y(k) \approx A \cdot s(kT_s)$$ Equation (8)

The weak signal $s(kT_N)$ is then recovered from the noisy channels by using the multi-sensor network systems of the present invention.

Usually, a preprocessing operation is needed to exclude the outlier packets based on the estimated signal-to-noise ratios (SNRs) and to normalize the packets based on the signal powers before estimating the delay factor and combining the signals. Thus, the multi-sensor demodulation device 10 provides signal fusion, automatic demodulation, modulation scheme classification, and the appropriate demodulation technique to effectively monitor the collected non-cooperative unknown signals without suffering form the disadvantages, shortcomings, and limitations of prior art techniques and devices.

Figure 3:
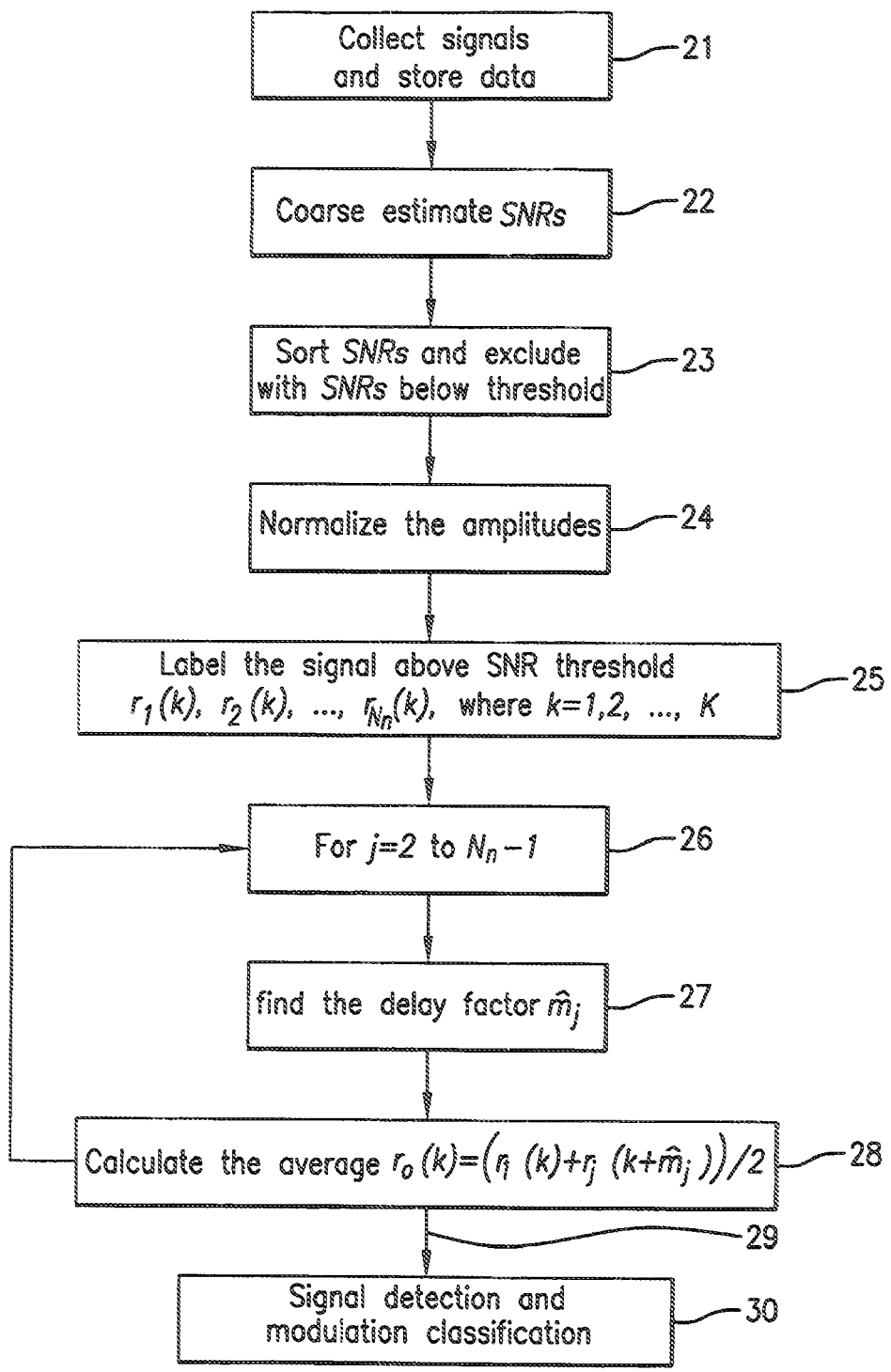
FIG. 3 is a software programming flowchart depicting software operations of non-cooperative demodulation in accordance with the present invention.

This invention can be implemented in either in hardware or software. FIG. 3 is a software programming flowchart that illustrates the operation of software in this invention's multi-sensor signal fusion article of manufacture with a storage medium encoded with machine-readable computer program code for more accurate descriptions of monitored signals. The software programming flowchart depicts the software operations of the signal preprocessing, delay factor estimation, and signal combining processes.

Referring now to FIG. 3, when this invention is implemented with software, the software operation begins with collecting signals in a means for collecting signals and storing data represented by Block 21, where signals collected from multiple sensors are transmitted to a digital signal processing unit in the master and stored in the memory for processing. In Block 22, a coarse SNR estimation is conducted in a means for coarse estimation in order to eliminate the outliers based on the SNR threshold. In a means for sorting represented by Block 23, the SNRs are sorted from high to low, and signals with a SNR below a given threshold are excluded. In Block 24 a means for normalization normalizes signals above a given threshold, and in a means for signal labeling, represented by Block 25, the signals are labeled from 1 to $N_n$, that is $r_j(k)$, $j=1, 2, \ldots, N_n$, based on the estimated values of SNRs. Here the index j is not related to the indices of the sensors. In Block 26 a means for correlating receives the signal with the highest SNR, $r_1(k)$, and correlates it with $r_2(k)$ to obtain the delay factor $\hat{m}_2$ in Block 27. In Block 28, a means for calculating averages $r_1(k)$ and $r_2(k+\hat{m}_2)$, which are defined as $r_s(k)$ and continuing the similar process, as shown in FIG. 3, for $r_3(k)$, $r_4(k), \ldots, r_N(k)$ finishes the looping process with the Block 26 correlating means and Block 27 delay factor resulting in a combined signal 29 fed to a signal detection and modulation classification block 29 for estimating the modulation scheme. Many of the variations of the multi-sensor demodulation device also apply to this invention's article of manufacture software embodiment.

Figure 4B:
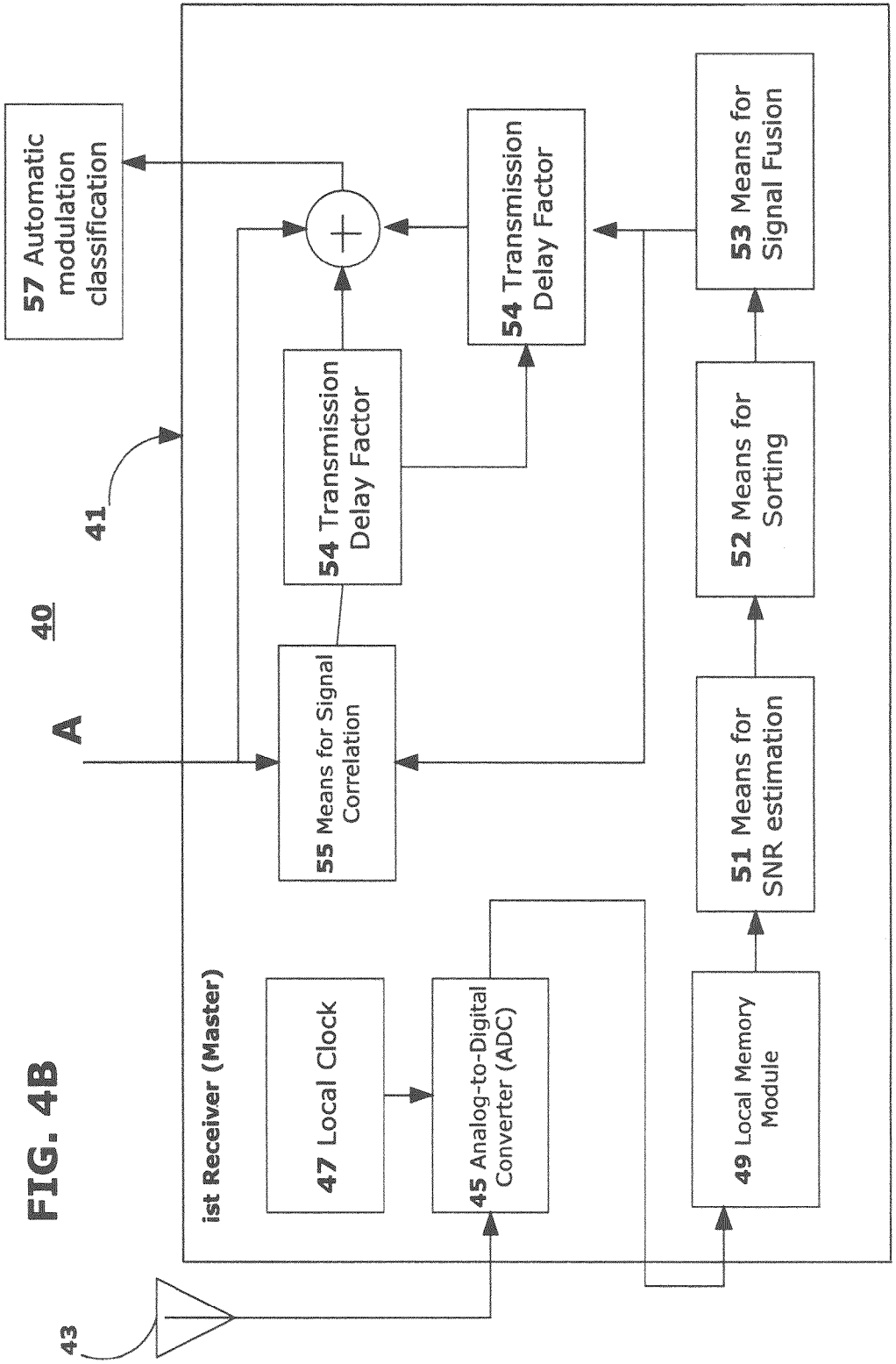
FIG. 4B is a second part of the conceptual block illustrating multi-sensor fusion with master and slave sensors in accordance with the present invention.

FIG. 4 is a conceptual block diagram of another hardware implementation of the multi-sensor non-cooperative demodulation device 40 of the present invention that provides more detail concerning the signal preprocessing, delay factor estimation, and signal combining aspects of the device with master and slave components. This embodiment provides a first, or master, sensor 41 and an $i^{th}$, or slave, sensor 42.

The signals are collected by sensor antennas 43 and 44, sent to Analog-to-Digital Converters 45 and 46 and then digitized by a local clock 47 and 48 where i, i=1, 2, ..., N, and saved in a local memory module 49 and 50. The master sensor 41 collects the multiple signal packets from local memories, then estimates coarse SNRs in a means for SNR estimation 51, excludes outliers in a means for sorting 52, and then normalizes all the signals in a means for signal fusion 53. A transmission delay factor 54 is estimated and then the signals are correlated in a means for signal correlation 55. Interpolation and over-sampling will be applied if needed. The signals are shifted and combined in a means for signal combining 56 before feeding to the automatic modulation classification block 57. FIG. 4 only demonstrates two sensors, one is the master and the other is the slave. The same architecture works for a large sensor network with massive numbers of slaves. Parallel processing can be used for estimating the delay factor and combing signals. Multiple master sensors can be used to distribute the signal fusion process in accordance with the present invention. Many of the variations of the multi-sensor demodulation device also apply to this invention's master/slave sensor configurations.

Figure 5A:
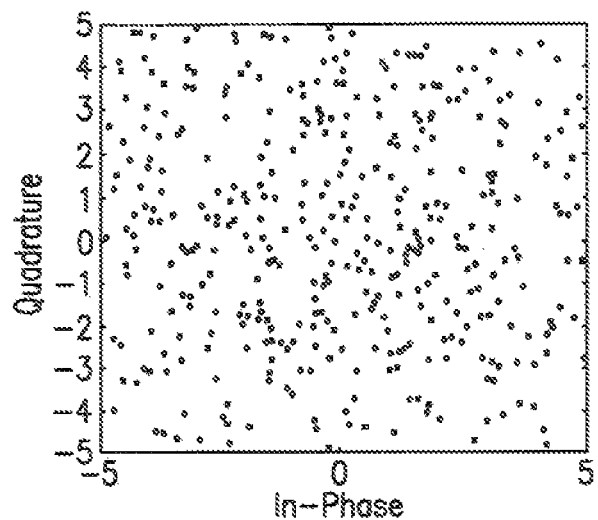
FIG. 5A is a chart illustrating the simulation result of a single sensor with a matched filter.
Figure 5B:
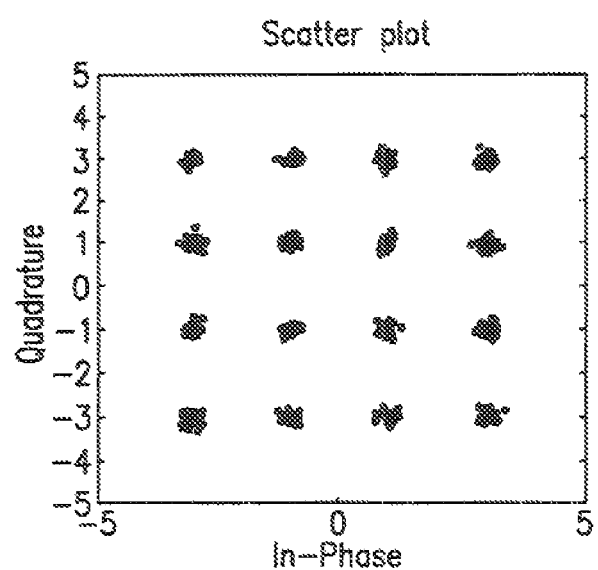
FIG. 5B is a chart illustrating the simulation result of multi-sensor signal fusion with a matched filter.

Referring now to the drawings, FIGS. 5A and 5B are charts illustrating simulation results of a single sensor and a multi-sensor signal fusion with matched filters that demonstrate the advantages in using multi-sensor signal fusion in accordance with this invention. The computer simulations were conducted by combining signals received from 100 receiving sensors. The SNR ratio and signal length at each single sensor is 0 dB and 512 samples, respectively. The signals are modulated as 16 QAM with root-raised-cosine filters. The roll-off factor is 0.25 and the over-sample rate is 4 samples per symbol. In order to simplify the simulations, all signals were digitized synchronously in time and modulation phase. The results of these computer simulations are shown in FIGS. 5A and 5B. The dots in FIG. 5A are recovered symbols at a single sensor which are very noisy, and are not recognizable for any constellation pattern. By contrast, the FIG. 5B multi-sensor signal fusion dots are arranged in a much clearer constellation pattern of 16 clusters. Therefore, the unknown signal is classified as QAM16 modulation scheme.

Figure 6:
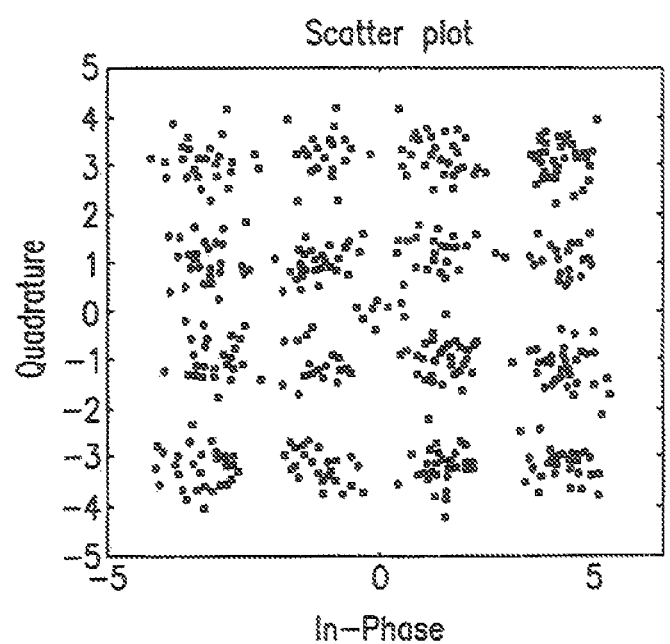
FIG. 6 is a chart illustrating the simulation result of multi-sensor signal fusion without matched filters.

Matched filters were used in the FIG. 5A and FIG. 5B simulations. FIG. 6 illustrates the simulation result of multi-sensor signal fusion without matched filters because in most non-cooperative communication operations, the structure of the matched filter is not always known so the matched filter cannot be used in those situations. The dots in FIG. 6 are the recovered symbols after multi-sensor signal fusion with no matched filter. Although the 16 clusters in FIG. 6 are not as concentrated as those in FIG. 5B, those skilled in the art should readily recognize them and classify the unknown signal as the QAM16 modulation scheme. After comparing the FIG. 5A single sensor results with the FIG. 5B and FIG. 6 multi-signal fusion results, it is readily apparent that the FIG. 5A single sensor modulation scheme at SNR=0 dB is almost impossible to discern, while the FIG. 5B and FIG. 6 multi-sensor results quite readily allow estimating the modulation scheme, even if the SNR is quite low.

The multi-sensor signal fusion technique can be developed in various implementations and embodiments. The concept applies to both analog and digital signals in any wired or wireless communication network with various architectures, to a wide frequency range, and to the channels in harsh environments.

Figure 7A:
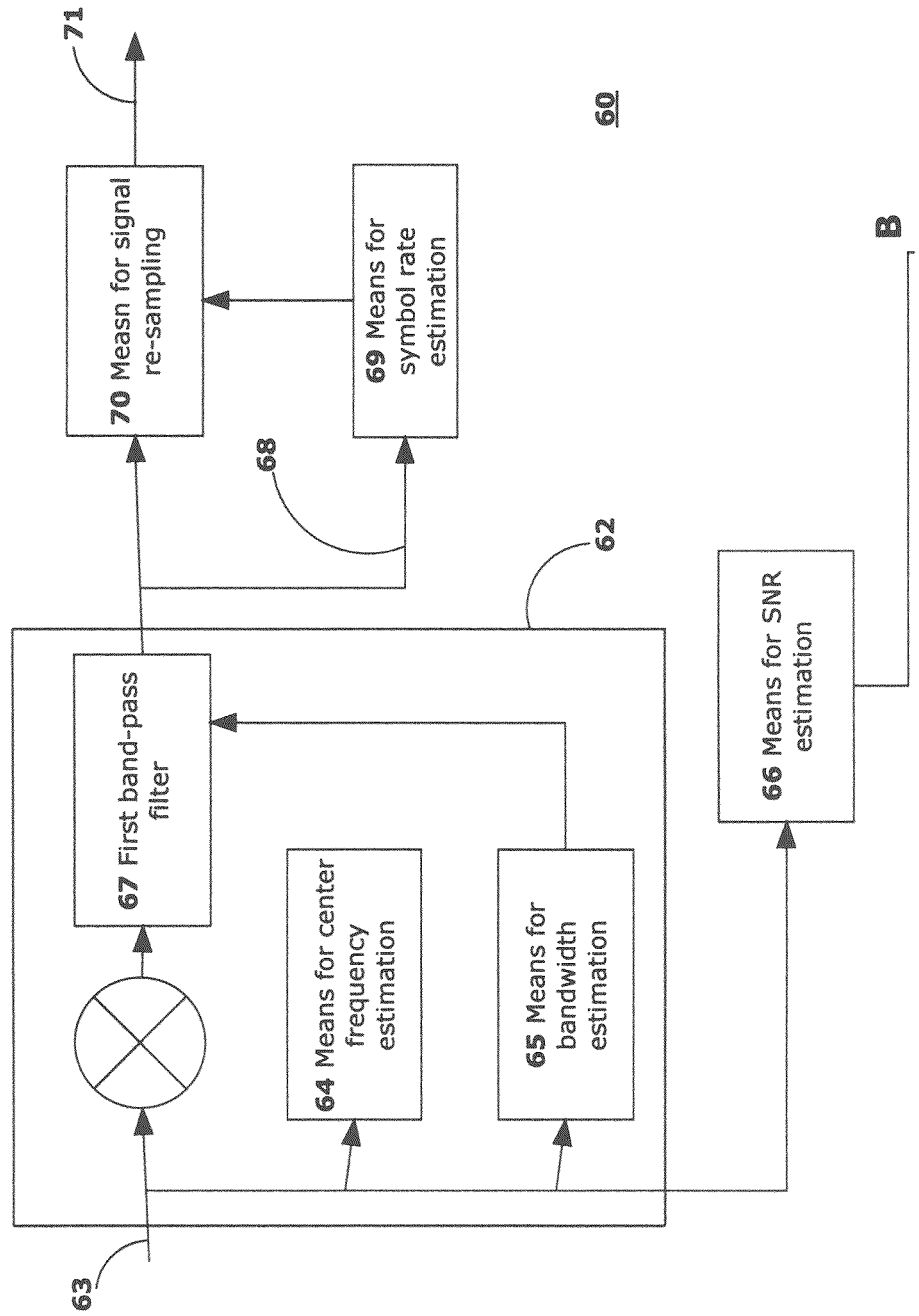
FIG. 7A is a first part of the conceptual block diagram depicting automated modulation classification for linear communication signals in accordance with the multi-sensor non-cooperative demodulation device of the present invention.
Figure 7B:
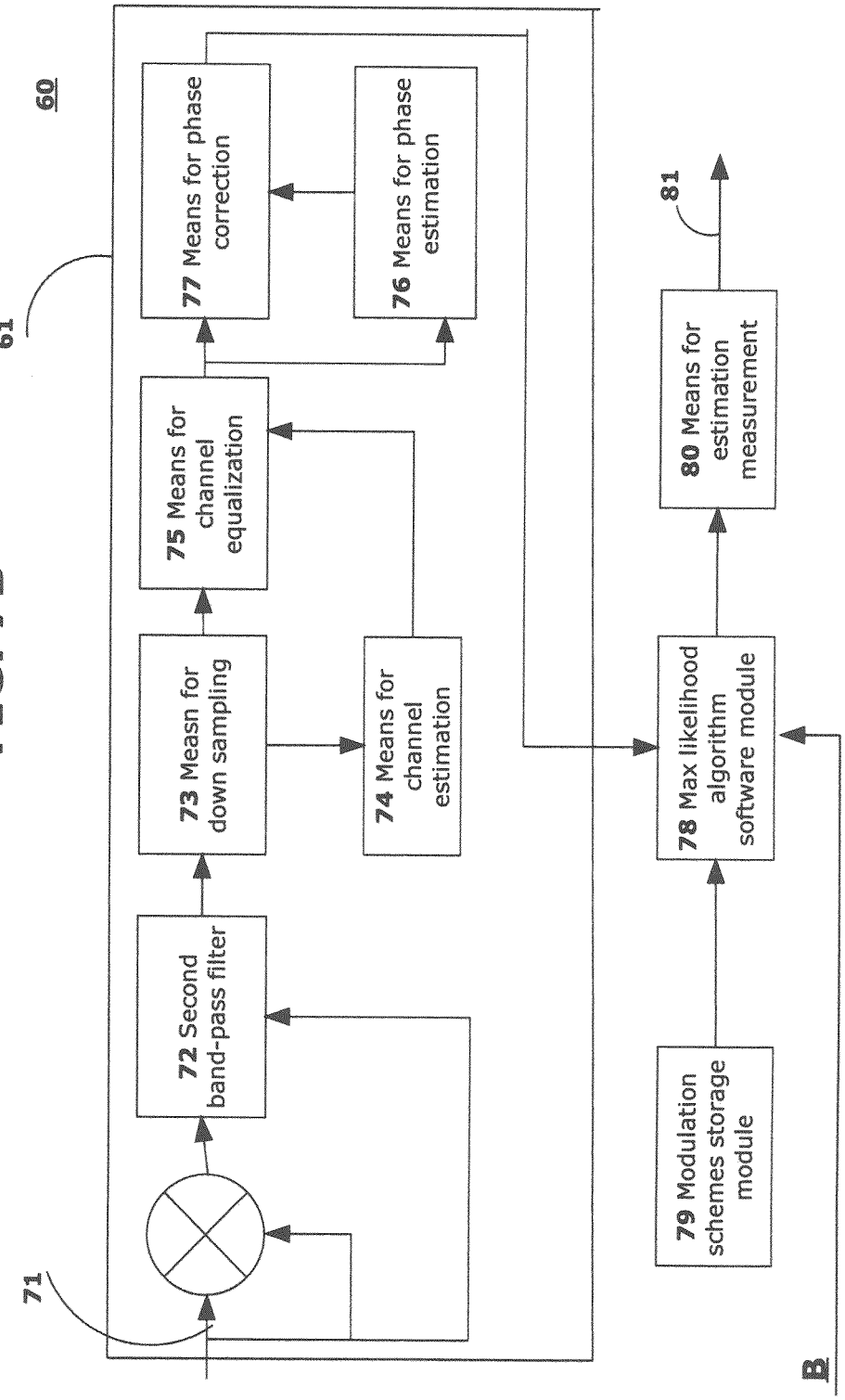
FIG. 7B is a second part of the conceptual block diagram depicting automated modulation classification for linear communication signals in accordance with the multi-sensor non-cooperative demodulation device of the present invention.

FIG. 7 is a conceptual block diagram depicting a multi-sensor non-cooperative linear digital signal classification device 60 for classifying linear digital signals including M-ary PSK and M-ary QAM modulation schemes in accordance with the present invention. This embodiment illustrates the processing sequence of the estimations of center frequency, bandwidth, SNR, and symbol rate, and gives a top-level view of automatic modulation classification of linearly modulated digital signals. The automated modulation classification includes, but is not limited to, analog, linear and nonlinear digital, and various multiple carrier signals.

This multi-sensor non-cooperative linear digital signal demodulation device 60 comprises a coarse modulation parameter estimation unit 62 and a fine modulation parameter estimation unit 61. The signals are collected by sensor antennas and combined by a signal fusion means not shown in this drawing. Referring now to the coarse estimation unit 62, the fused multi-sensor signal 63 is used for coarse estimations of the center frequency in a means for center frequency estimation 64, coarse estimations of bandwidth in a means for bandwidth estimation 65, and coarse SNR estimations in a means for SNR estimation 66. The signal is down-converted and filtered in a first band-pass filter 67 based on the coarse estimations of the center frequency and bandwidth. Then a filtered signal output 68 is provided to a means for symbol rate estimation 69 and a means for signal re-sampling 70 to the integer number of samples per symbol. The signal re-sampling means 70 sends a sampled, filtered output 71 to the fine modulation parameter estimation unit 61, which functions as a master sensor.

Referring now to the fine estimation unit 61, or master sensor, the residual center frequency is removed from the sampled, filtered output 71 and the signal is mixed and filtered once again with a second band pass filter 72 that is tighter than the first band pass filter 67. The twice-filtered output signal is down sampled to the symbol rate, if needed, in a means for down-sampling 73 before channel estimation is performed in a means for channel estimation 74 and before channel equalization occurs in a means for channel equalization 75. The modulation phase offset is estimated in means for phase estimation 76 and corrected in a means for phase correction 77. A maximum likelihood algorithm software module 78 estimates the most likely modulation scheme based on the estimated SNR and possible modulation schemes stored in a modulation schemes storage module 79. The confidence of the modulation estimation is measured in a means for estimation measurement 80 and estimation results, including modulation scheme, SNR, bandwidth, symbol rate, center frequency residual, and estimation confidence, are reported in final estimate, represented by arrow 81 once the multi-sensor signal is obtained and combined. The automatic modulation classification does not depend on, and is not limited to, the signal fusion methods. In other words, any existing or new automatic modulation classification methods can be used in this invention. Many of the variations of the multi-sensor demodulation device also apply to this invention's multi-sensor non-cooperative linear digital signal demodulation embodiment.

Figure 8:
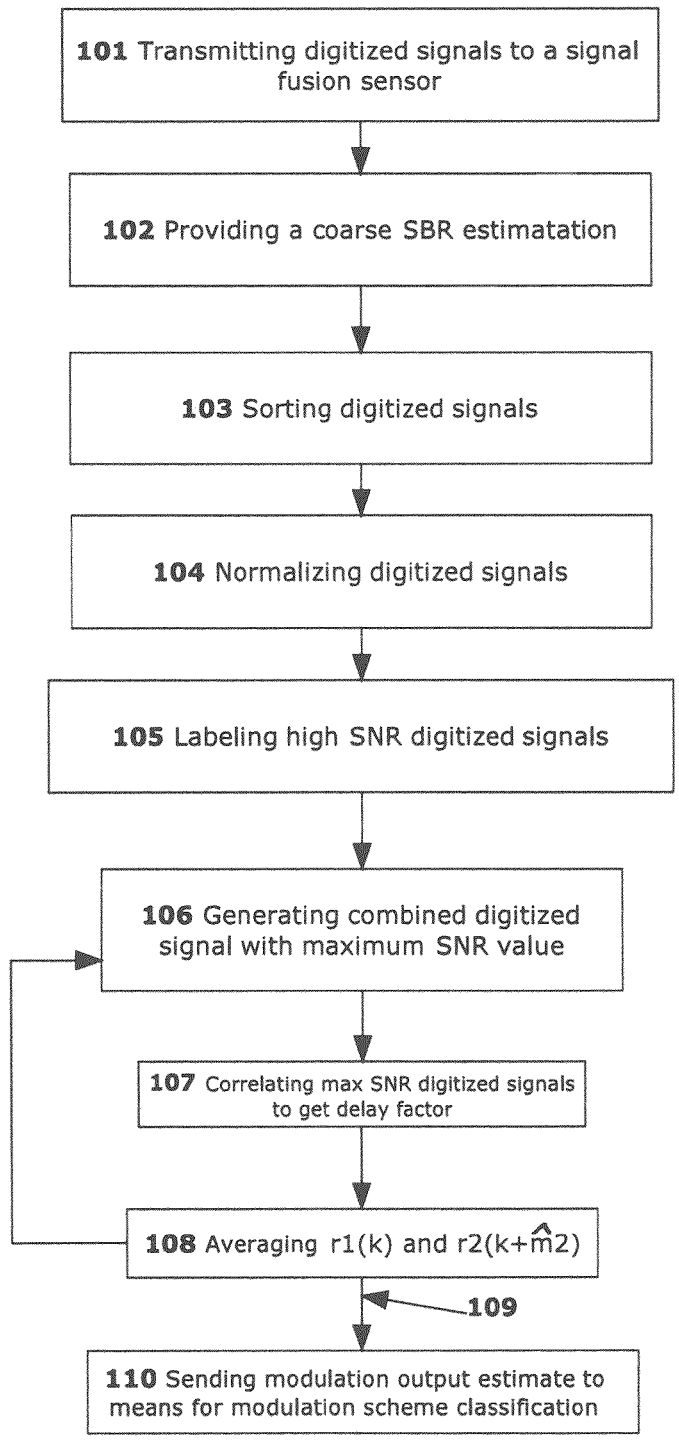
FIG. 8 is a flowchart depicting the steps of the method for achieving higher accuracy descriptions of monitored signals in a non-cooperative environment with multi-sensor non-cooperative demodulation in accordance with the present invention.

Referring now to FIG. 8, there is depicted a flow diagram of the steps of this invention's method for achieving increased fidelity and more reliable simulation of monitored non-cooperative signals with multi-sensor non-cooperative demodulation comprising the steps of receiving non-cooperative signals, s(t), from an unknown transmission source in a group of sensors, each of the sensors having a sampling clock and a local memory, with the non-cooperative signals having weak signals, a given modulation and a given demodulation; digitizing a group of received signals with the group of sensors; providing digitized signals, with the digitized signals including the multiple non-cooperative signals; and transmitting the digitized signals to a signal fusion sensor, which are represented by Block 101. The step of providing a coarse SNR estimation from a means for coarse estimation to extract the weak signals based on a coarse SNR threshold is represented by Block 102 and the step of sorting the digitized signals according to an SNR value below a given threshold in a means for sorting is represented by Block 103. The step of normalizing digitized signals with SNR above a given threshold is represented by Block 104, and the step of labeling the high SNR digitized signals in a means for signal labeling based on multiple estimated SNR values is represented by Block 105.

This invention's method continues with the steps of generating a combined digitized signal with a maximum SNR value, $r_1(k)$, in a means for correlating, represented by Block 106; correlating the maximum SNR digitized signals with $r_2(k)$ to obtain a delay factor $\hat{m}_2$, represented by Block 107; averaging $r_1(k)$ and $r(k+\hat{m}_2)$ in a means for calculating, represented by Block 108; and transmitting a combined digitized signal to a means for automatic modulation for a modulation output estimate, represented by Block 109. Block 110 represents the final steps of sending the modulation output estimate to a means for modulation scheme classification that selects a demodulation technique by evaluating the modulation output estimate and the given demodulation; generating a matching demodulation output in the modulation scheme classification means; sending the matching demodulation output to a means for signal demodulation to generate a demodulated signal; and simulating the non-cooperative signals without unwanted channel noise, disturbances and interference allowing a user to covertly identify and monitor the unknown transmission source with an improved fidelity and reliability. Many of the variations of the multi-sensor demodulation device also apply to this invention's methods.

Figure 9:
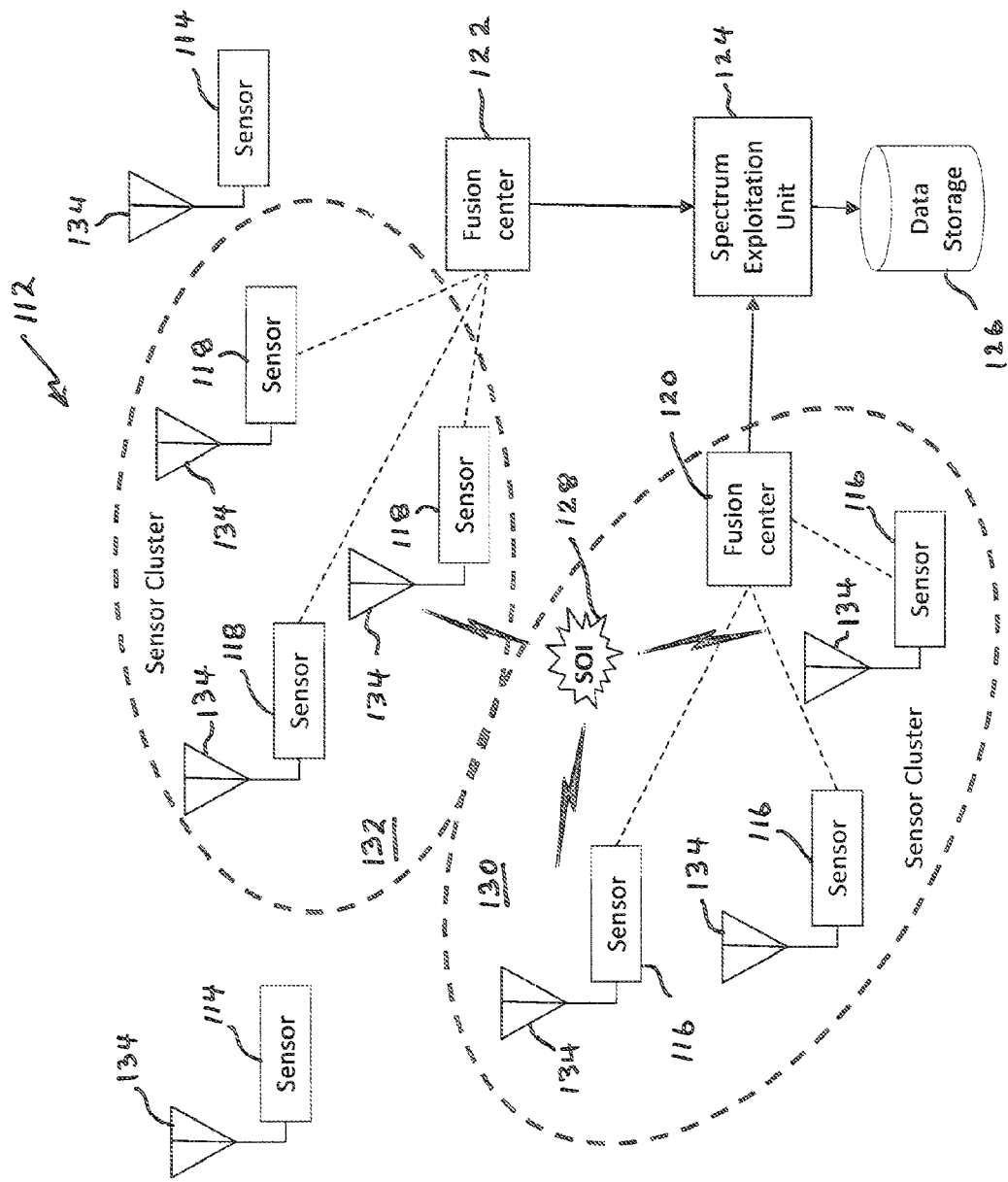
FIG. 9 is a diagram illustrating a communication sensor network according to one embodiment of the present invention including several sensor clusters and single radio frequency sensors and including fusion centers, a spectrum exploitation unit and a data storage in accordance with the present invention.

The present invention can be continued to including asynchronous and non-coherent sensors to the network. In this scenario, there are time, phase, and frequency offsets among asynchronous sensors. Two methods are presented they are signal decision fusion and raw signal fusion. Hardware and software components comprising radio frequency (RF) sensors 114, 116 and 118, communication network 112, fusion centers 120, 122, a spectrum exploitation unit (SEU) 124, and a data storage device 126 as shown in FIG. 9. The fusion center (master) 120 or 122 interacts with distributed RF sensors (slaves) 114, 116 and 118 via the communication network 112 to collect the signal of interest (SOI) 128 at the distributed locations. The signal collected at the RF sensor is called a local signal copy. Multiple local signal copies or the processing results of the multiple local signal copies are delivered to the fusion center to form a statistical decision. More than one fusion center may be deployed such as 120 and 122. The decision is a set of estimation result used by the SEU for spectrum mapping and exploitation.

In a given frequency band or range, time frame and geographic location, there may exist many signals. The SOI 128 is the one that the SEU 124 will exploit. In one preferred embodiment, the SOI 128 can be transmitted by any RF equipment in any format which includes but is not limited to the signal using single or multiple antennas, single and multiple carrier frequencies, frequency spreading or hopping, various multiple-access or multiplexing, analog or digital modulation with all possible modulation and coding schemes, etc.

The RF Sensor 114, 116 and 118 in this application can be a device which can follow the request of the fusion center to capture a SOI for a very short period of time, store it in a temporary memory, and pass raw or processed signal copies to the fusion center 120 or 122. The sensor 114, 116 and 118 can be homogeneous or heterogeneous and the sensor network, such as sensor cluster 130 or 132 can be synchronous or asynchronous. The sensor 114, 116 and 118 can be as simple as a RF relay unit or as complex as a blind signal classifier (BSC) or a specific emitter identifier (SEI). As shown in FIG.

9, each sensor 114, 116 and 118 has an antenna 134. In this application, two categories of sensors are employed: thick and thin sensors.

A thick sensor is designed to perform the required RF signal collection and processing functions. It can be used, or ready to be used, as a stand-along device such as those shown at 114 in FIG. 9. A thick sensor is usually a sophisticated and expensive device with powerful signal processing capability designed and tailored for applications such as blind signal parameter estimation, modulation classification, and emitter identification. The thick sensor is able to make decisions (soft or hard) locally.

A thin sensor is a basic RF transceiver with very limited signal processing options such as carrier frequency tuning, filtering, and analog to digital or digital to analog conversion in order to pass the raw data to the fusion center 120 or 122 properly. It is usually an inexpensive, widely available, and less accurate device. However, the thin sensor can also be a part of a thick sensor. That is, a thick sensor which only offers limited functions or operations to the fusion center for spectrum exploitation as if it is a thin one. Many existing RF equipments such as radios, WiFi devices, and wireless phones can be leveraged as thin sensors to perform the RF spectrum sensing for the fusion center under an agreement with no or little modification to the equipments. Since the fusion center in this scenario will be the secondary user, the sensing function will be operated in the background or during idling session of the equipments without interfering or interrupting the primary functions. The thin sensor is usually not able to make exploitation decision locally.

Thick and thin sensors 114, 116 and 118 can be used collaboratively for the fusion center 120 or 122 although the method of data processing will be handled differently. Both types of sensors 114, 116 and 118 can be custom-made devices, programmable devices, existing radios or software defined radios, wireless phones, etc. The sensors collect a snapshot (a short time duration) of the signal as local signal copies under the request of the fusion center 120 or 122. The sensors 114, 116 and 118 in the network 114, 116 and 118 may or may not be synchronized and coherent. The processing power in the fusion center 120 or 122 will be sufficient in most applications since the signal collection task is performed periodically in the spectrum exploitation unit 124.

In one preferred embodiment, the communication network 112 sends a request to all participated distributed sensors 114, 116 and 118, transports the raw signal copies or information obtained from the signal copies from the distributed sensors 114, 116 and 118 to the fusion center 120 or 122, and feedback the spectrum exploitation result from SEU 124 to the sensors 114, 116 and 118 if needed. The collected signals may be sent in the form of time-stamped data packets via any available route and suitable means, wired or wireless, and any modulations and multiplexing accesses methods. An existing communication network 112 may be used fully or partly for spectrum exploitation applications (as the second user) under an agreement. In this case, the network security, reliability, and hand-shaking between networked sensors 114, 116 and 118 are all handled by the existing communication network 112.

In another preferred embodiment of the present invention, the fusion center 120 or 122 applies all the necessary or appropriate signal processing functions to the raw signal copies or the information obtained from the signal copies in order to combine the multiple inputs delivered by distributed sensors 114, 116 and 118 to a single output using statistics means. Depending on the application requirements, the inputs can be the information obtained from local signal copies such as the local hard/soft decisions, or raw/partially processed local signal copies. The outputs can be a global decision of a group of parameters, formats, and support data of the SOI 128 including but not limited to carrier frequency and sub-carrier frequencies, bandwidth, symbol rate and pulse shape, signal power, modulation scheme, modulation index, signal-to-noise ratio (SNR), headers and prefixes, coding methods, transmitter type and license, as well as emitter locations. The fusion center 120 or 122 chooses a set of sensors 114, 116 and 118 from all available sensors 114, 116 and 118 to form a best cluster/network based on the best knowledge of the operation requirements, environment quality, and geometrical conditions. For a massive sensor network, multiple clusters such as exemplary clusters 130 and 132 with multiple fusion centers such as 120 or 122 may be needed or used and the multiple outputs will be further combined to a meta-global decision 136, such as that shown in one embodiment in FIG. 11, before sending to the SEU 124 for spectrum exploitation as shown in FIG. 10.

Figure 10:
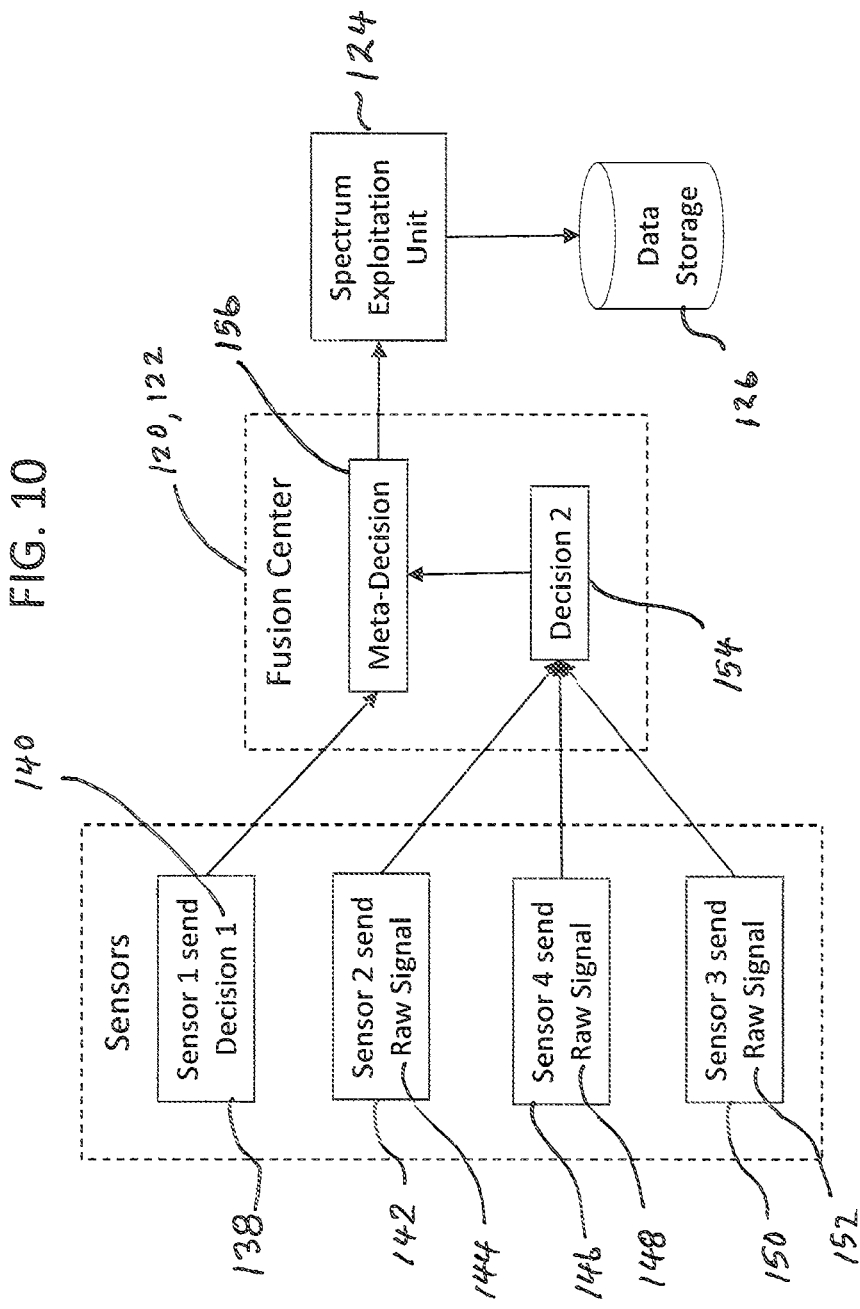
FIG. 10 is a conceptual block diagram of a communication sensor network illustrating combining different fusion methods in accordance with the present invention.

In the exemplary preferred embodiment shown in FIG. 10, a single sensor 138 such as a thick sensor 1 can make a decision 1 (140) which can be sent to a fusion center 120 or 122 which can process decision 1 (140) which is transmitted or forwarded to fusion center 120 or 122. In addition, several sensors 142, 146 and 150 such as thin sensors 2, 3 and 4, as shown in FIG. 10, can provide raw signals, 144, 148 and 150, respectively, that are transmitted or forwarded to fusion center 120 or 122 wherein the raw signals can be combined or processed into decision 2 (154). Then the processed decision 1 (140) and decision 2 (154) can be combined or processed into a meta-decision 156 which can be sent to the SEU 124.

Depending on the application, a fusion center 120, 122 may include a blind signal classifier (BSC) and/or a specific emitter identifier (SEI) which takes an input signal with unknown modulation scheme and unknown parameters such as carrier frequency and phase, symbol time duration, bandwidth, power, SNR, etc. and provide the estimates for all desired unknowns. In one exemplary embodiment, a fusion center 120 or 122 can also be a part of a sensor 114, 116 and 118.

The current state-of-the-art BSC can process a received signal in the form of $$r(t,x)=h(t)*e^{j(\omega t+\phi)}s(t,x)+n(t)$$

with an unknown vector x including all unknown signal and channel parameters such as modulation index, carrier frequency and phase, pulse shape and timing, channel magnitude and phase, SNR, oversampling rate, and bandwidth. If the signal uses Orthogonal Frequency Division Multiplex (OFDM), it also includes the unknown OFDM modulation parameters such as cyclic-prefix, FFT size, etc. In the above equation, s(t) is the transmitting analytic signal, n(t) is additive white Gaussian noise (AWGN) with unknown noise varies, $e^{j\omega t+\phi}$ describes the non-coherency between the transmitter and receiver, and h(t) is the unknown channel impulse response including the receiver gain. Some BSC are equipped with blind equalizer to compensate the unknown fading and pulse shaping.

The Specific Emitter Identifier (SEI) identifies the features such as the finger print, the dynamic response, and the assigned code which is unique to a specific emitter. Depending on the application, a priori art or well know art can be used for SEI. The identification result is sent to the SEU 124 for spectrum mapping and exploitation.

Figure 15:
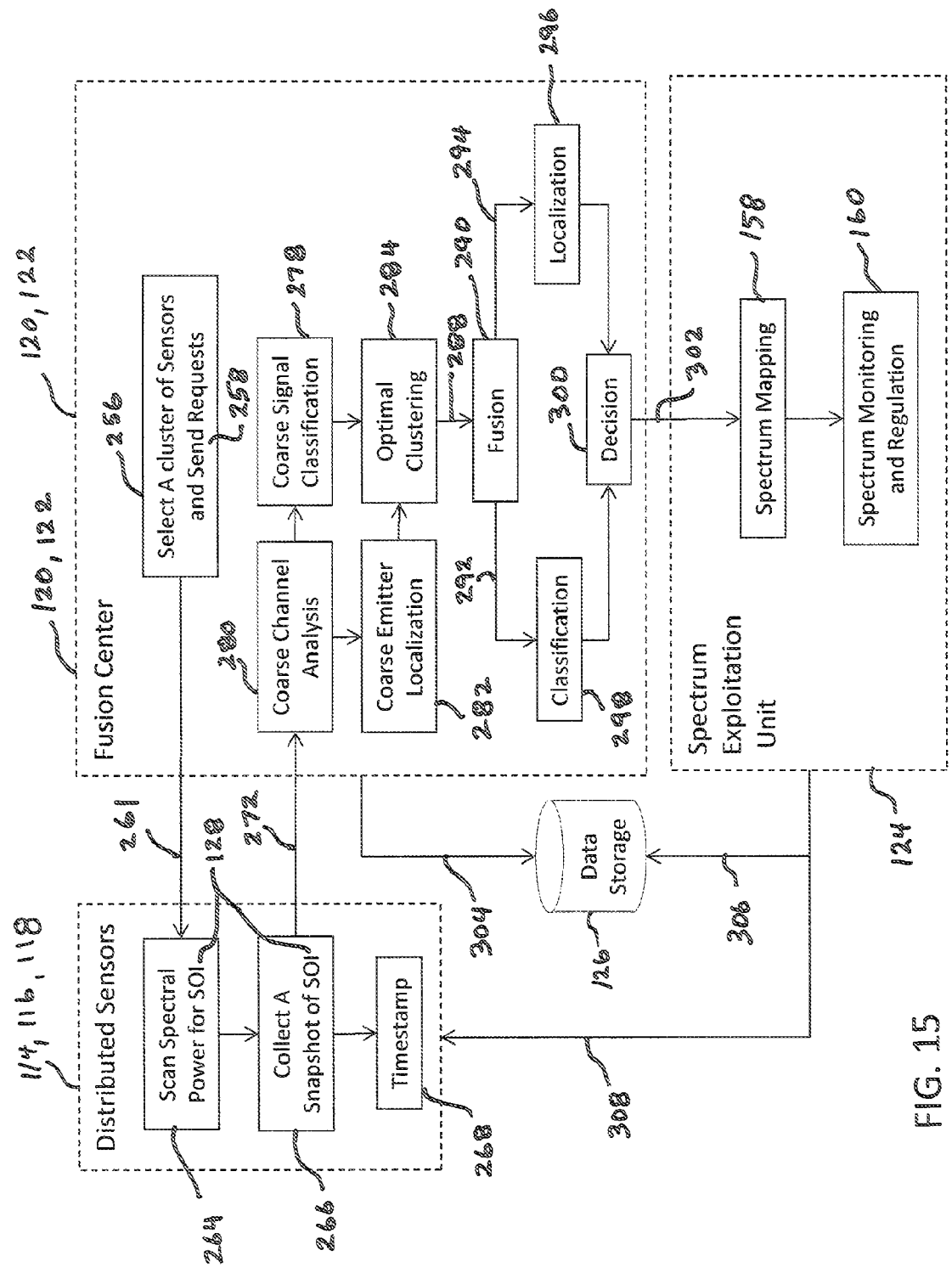
FIG. 15 is a flowchart depicting the steps of the method for achieving higher accuracy descriptions of monitored signals in a non-cooperative environment with multi-sensor non-cooperative demodulation in accordance with the present invention.

As shown in FIGS. 9, 10 and 15, the Spectrum Exploitation Unit (SEU) 124 uses the decision provided by the fusion centers 120, 122 for spectrum mapping 158 and exploitation applications such as spectrum monitoring and regulation 160. The SEU can feedback useful information to the sensors 114, 116 and 118 in distributed locations which includes but is not limited to available frequency spectrum, emitter locations, channel conditions, signal power requirement, primary and secondary spectrum users information, threat warming, interferences, network routing paths, etc. The SEU124 may include hardware and software such as custom made processors or a computer, human-machine interface, data storage, communication interface, and software or firmware.

Referring now to FIGS. 11 through 14, the fusion methods that can be employed according to present invention are discussed below. Both decision fusion and raw signal fusion can be used for distributed signal copies.

Figure 11:
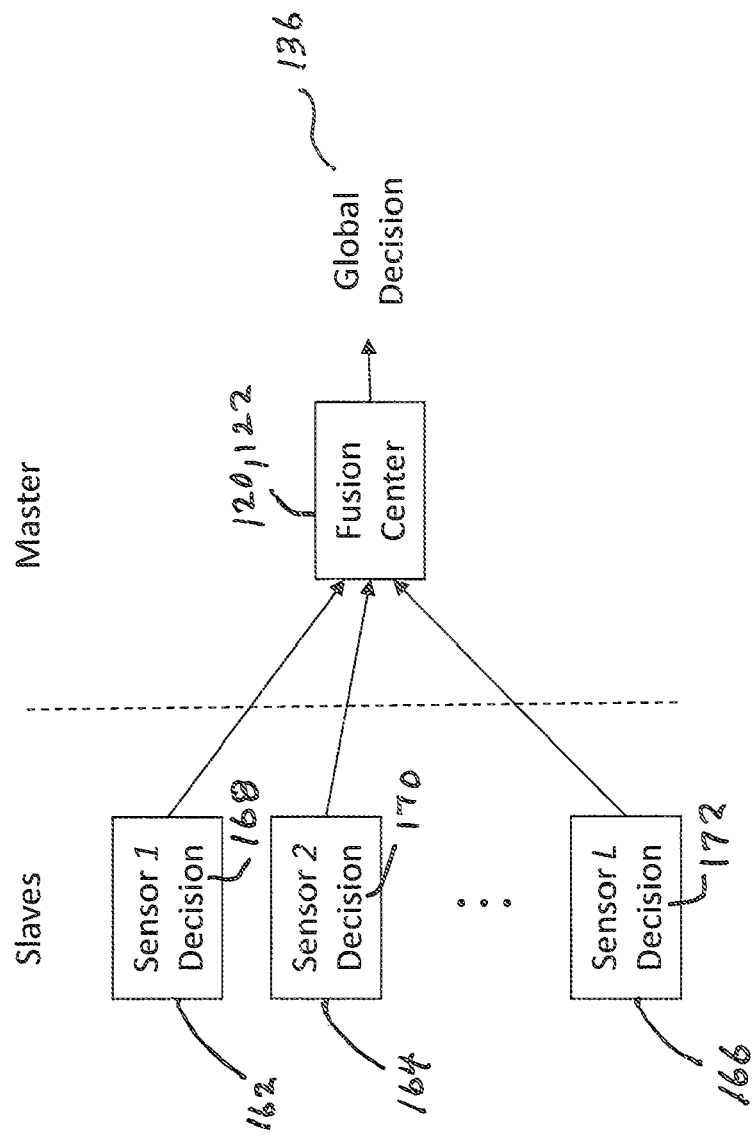
FIG. 11 is a conceptual block diagram of a hard decision fusion communication sensor network illustrating thick sensors making hard independent decisions locally before sending them to a fusion center, while the thin sensors deliver the raw signal snapshots to the fusion center in accordance with the present invention.

In the decision fusion method, the exemplary embodiments include hard decision fusion and raw data fusion. If a decision, such as an estimated modulation scheme, for a local signal copy is available, hard decision fusion can be used. As shown in FIG. 11, the hard decisions are combined in the fusion center 120, 122 to yield a global decision 136. Decision fusion applies to the signal copies collected from both thick and thin sensors 114, 116 and 118 which may be considered as slaves as shown in FIG. 11. The slaves may include sensors 1 (162), 2 (164) up to L (166) which provide decisions 168, 170 and 172, respectively. The thick sensors make independent decisions locally and then send them to the fusion center 120, 122 in order to reduce the data transmission bandwidth as shown in FIG. 11. On the other hand, the thin sensors deliver the raw signal snapshots to the fusion center 120, 122 and the decisions are made in the fusion center 120, 122 for all received signal copies. Since all the decisions are made independently, this method does not need accurate synchronization and coherence among signal copies. However, the former occupies much less transmission bandwidth since only the compressed data (decisions) are sent to the processing or fusion center 120, 122. Decisions can be made in various ways and many existing investigations are available for decision making. Maximum likelihood test is an example which assumes $u^1, u^2, \ldots, u^L$ to be L independent decisions with Q hypotheses and make the global decision $d=H_i$ based on the conditional probability $$i_{max} = \arg\max_i P(d = H_i \mid u^1, u^2, \ldots, u^L)$$

By assuming the equal distribution of hypothesis, it is equivalent to the likelihood $$i_{max} = \arg\max_i P(u^1, u^2, \ldots, u^L \mid H_i) = \arg\max_i \prod_{l=1}^{L} P(u^l \mid H_i)$$

where, $P(u^1, u^2, \ldots, u^L \mid H_i)$ is the joint probability under hypothesis $H_i$, $P(u^i \mid H_i)$ is the probability of decision $u^i$ under the hypothesis $H_i$, and i=1, 2, . . . , Q. In some applications such as the Base Station Controller (BSC) with AWGN channel, if there are only two hypothese, $P(u^i \mid H_i)$ can be calculated. For more than two hypotheses, the calculation of $P(u^i \mid H_i)$ becomes complicated and the computer simulation method can be used to generate a table of probabilities, known as the confusion table, for all $P(u^i \mid H_i)$ values.

For multiple unknowns, hard-decisions for all unknowns need to be made. In other words, the above process will be repeated until all unknowns are decided.

Figure 12:
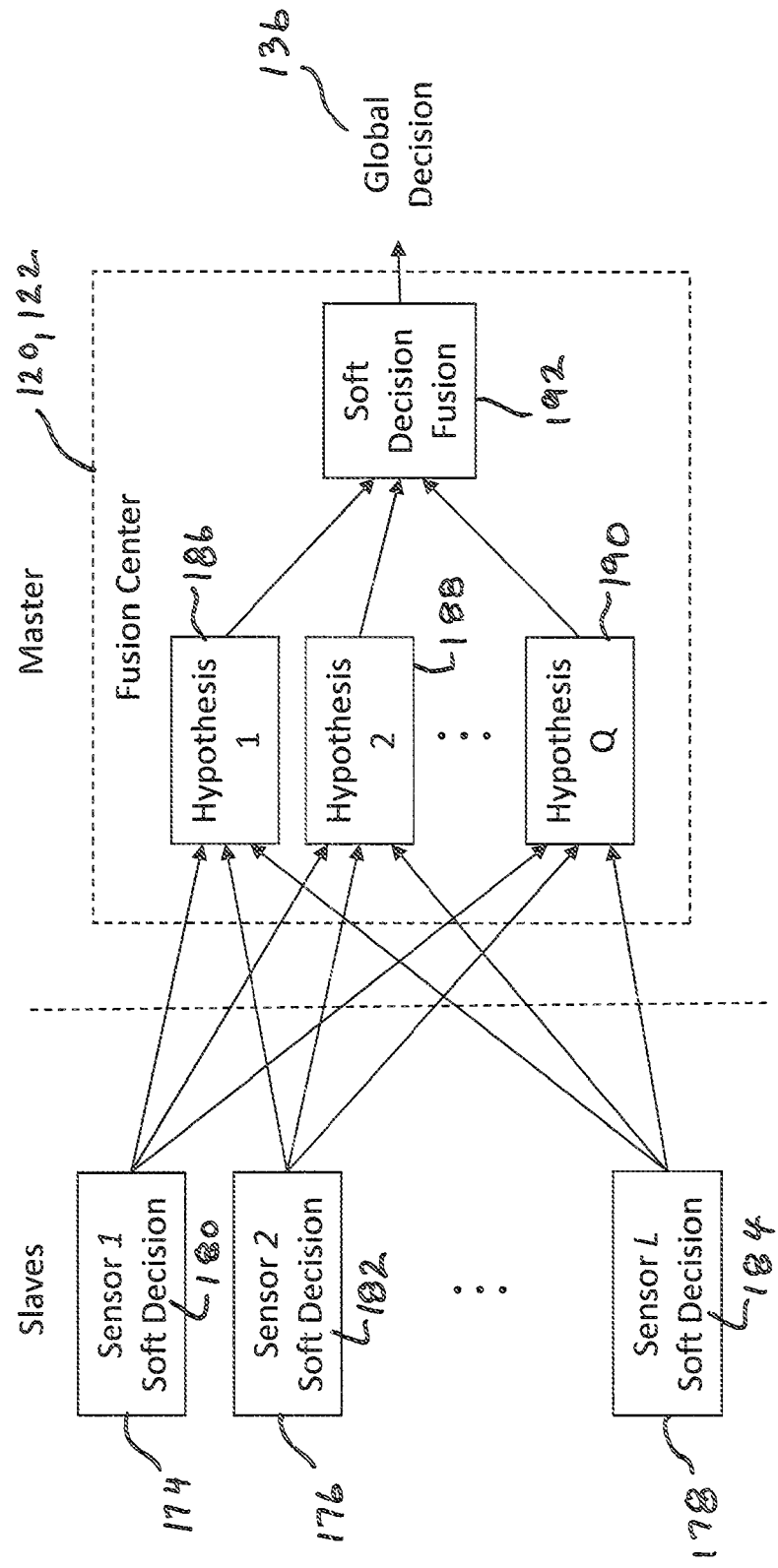
FIG. 12 is a conceptual block diagram of a soft decision fusion communication sensor network illustrating thick sensors making independent soft decisions locally before sending them to a fusion center, while the thin sensors deliver the raw signal snapshots to the fusion center in accordance with the present invention.

Referring now to FIG. 12, if a soft decision for a local signal copy is available, soft-decision fusion can be used. The soft decisions are combined in the fusion center 120, 122 to yield a global decision 136. Like the hard decision case, soft decision fusion applies to the signal copies collected from both thick and thin sensors 114, 116 and 118 which may be considered as slaves as shown in FIG. 12. The slaves may include sensors 1 (174), 2 (176) up to L (178) which provide soft decisions 180, 182 and 184, respectively. The thick sensors make independent soft decisions locally then send the scores to the fusion center 120, 122 in order to reduce the data transmission bandwidth as shown in FIG. 12. As was the case with hard decision fusion, the thin sensor delivers the raw signal snapshots to the fusion center 120, 122. Then the soft decisions are made in the fusion center 120, 122 for all received signal copies. Soft decision fusion does not give the solid results locally but provides a set of scores leading to the hard decision. For example, in the maximum-likelihood based Base Station Controller (BSC) in FIG. 11, the linear digital modulation classification among Q hypotheses 186, 188 and 190 will provide Q scores related to the likelihood values. Those scores from all distributed sensors are soft-decisions combined within the fusion center 120, 122 to provide a soft decision fusion 192 to yield a global decision 136. Like hard decision cases, the soft decision fusion does not need accurate synchronization and coherence among sensors 114, 116 and 118 and the thick sensor occupies much less transmission bandwidth.

Although the soft decision fusion method is a little less bandwidth efficient compared with the hard decision one, it loses less information and usually demonstrates a better decision making performance. Soft decisions can be implemented in various ways. An example is to use maximum likelihood as shown below. Assuming $r^1, r^2, \ldots, r^L$ are L independent input strings sent to the maximum likelihood estimator with Q hypotheses, the global decision $d=H_{imax}$ is made by choosing $$i_{max} = \arg\max_i P(d = H_i \mid r^1, r^2, \ldots, r^L)$$

By assuming the equal distribution of hypothesis, it equivalent to the likelihood $$i_{max} = \arg\max_i \{\log P(r^1, r^2, \ldots, r^L \mid H_i)\} = \arg\max_i \sum_{l=1}^{L} \log P(r^l \mid H_i)$$

where, $P(r^1, r^2, \ldots, r^L \mid H_i)$ is the joint probability of L inputs under hypothesis $H_i$ and $P(r^i \mid H_i)$ is the probability of $r^i$ under hypothesis $H_i$, l=1, 2, . . . , L and i=1, 2, . . . , O. Unlike the hard decision case, the $l^{th}$ sensor in the thick sensor case sends a set of scores (soft decisions):

$$\{\log P(r^l \mid H_1), \log P(r^l \mid H_2), \ldots, \log P(r^l \mid H_Q)\} \text{ for } l=1, 2, \ldots, L$$

to the fusion center 120, 122, where log $P(r^l \mid H_i)$, for I=1, 2, . . . , Q, is calculated locally in the $l^{th}$ sensor. If the input $r^l$ is the analytic baseband signal with a linear modulation scheme and an unknown fixed carrier phase offset, $P(r^l \mid H_i)$ can be calculated by the well-known averaging likelihood ratio test with the phase averaged over 360 degrees. The soft decision is combined in the fusion center to form the global decision $d=H_{imax}$.

For multiple unknowns, soft-decisions for all unknowns need to be made. In other words, the above process will be repeated until all unknowns are decided.

Figure 13:
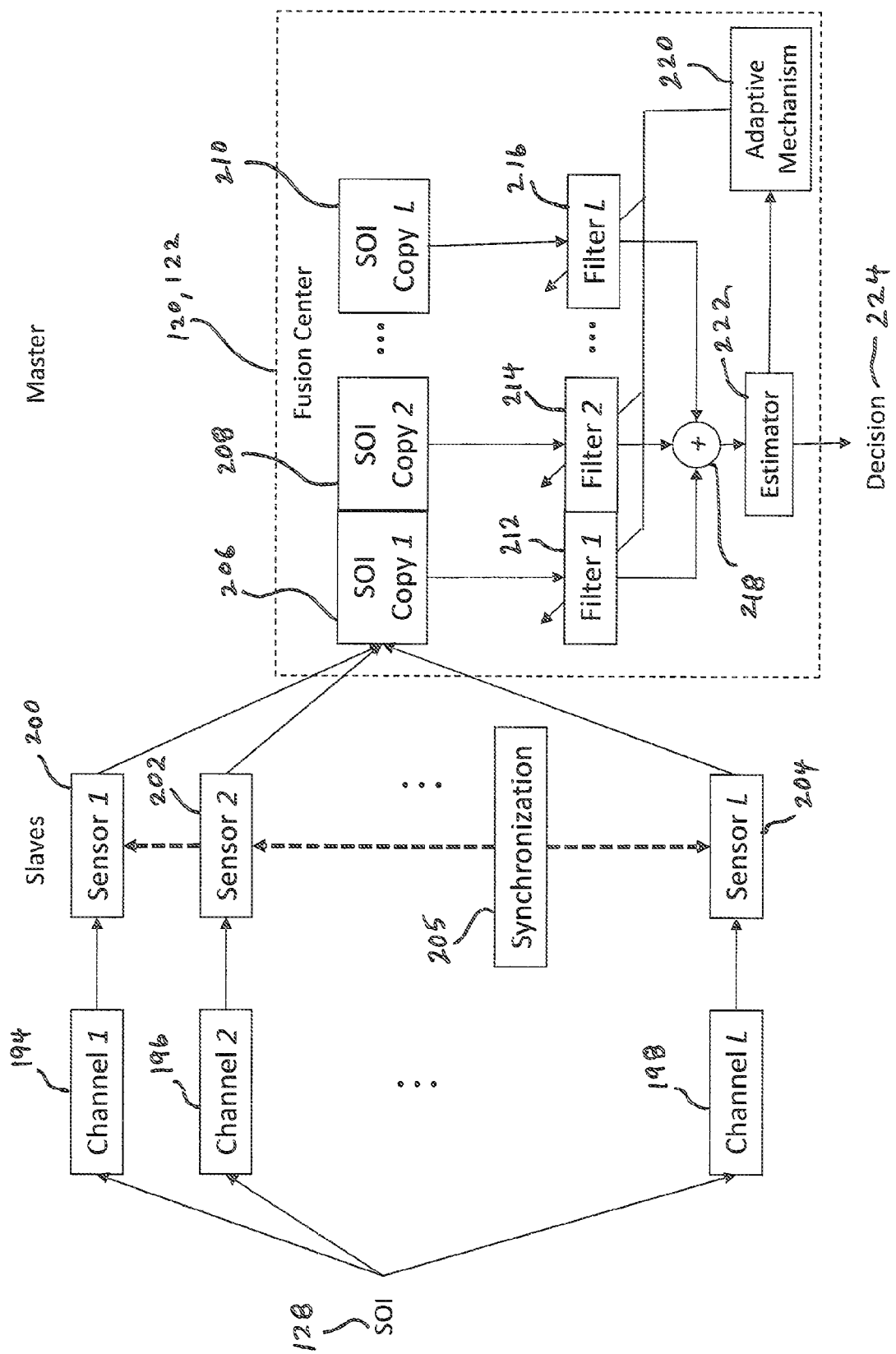
FIG. 13 is a conceptual block diagram illustrating synchronous signal fusion if the signal copies are coherent and synchronous in accordance with the present invention.
Figure 14:
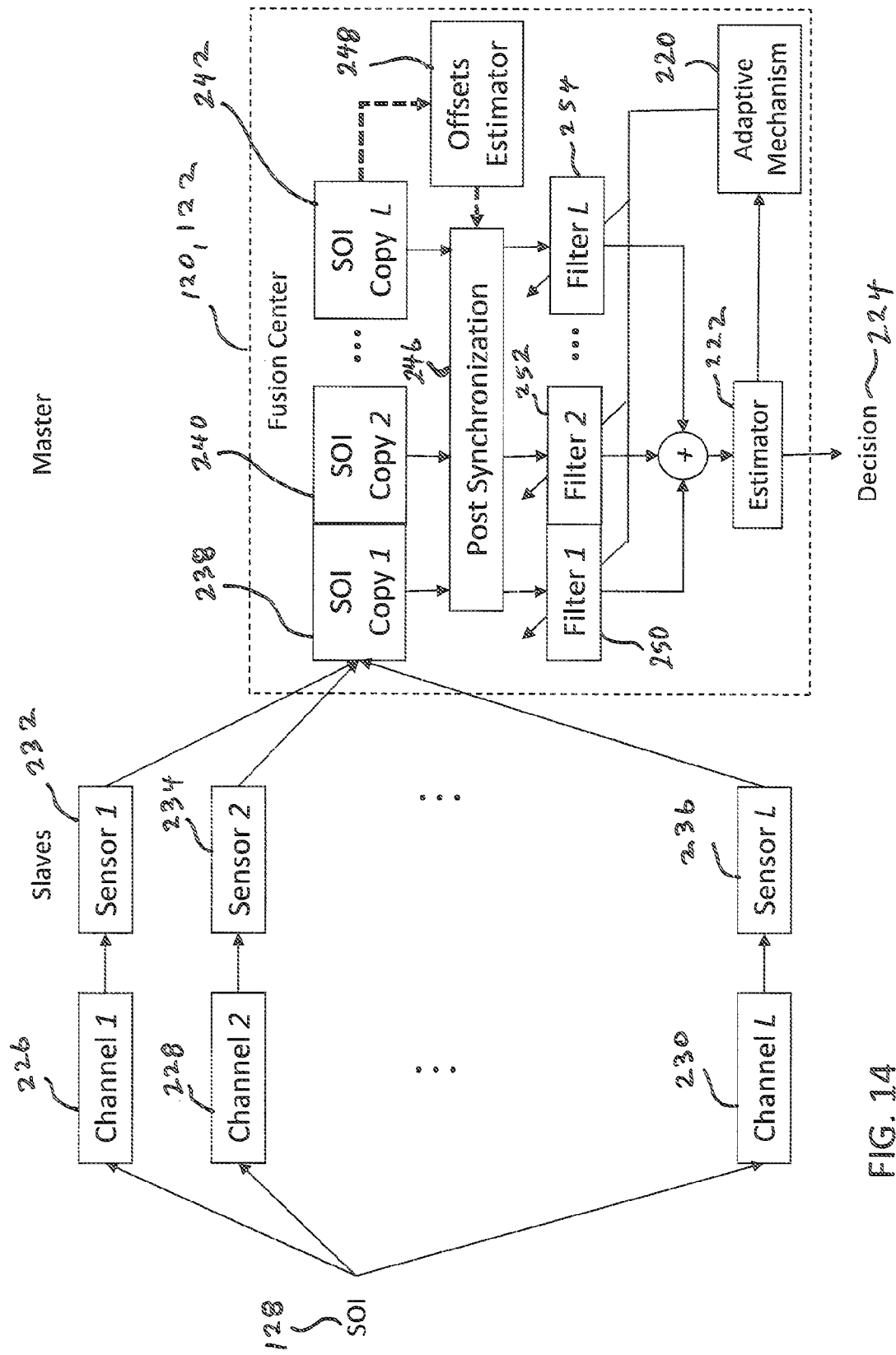
FIG. 14 is a conceptual block diagram illustrating asynchronous signal fusion if the signal copies are not coherent and synchronous in accordance with the present invention.

Referring now to FIGS. 13 and 14, these are conceptual block diagrams of a raw data fusion method which can be either synchronous or asynchronous, respectively.

When only thin sensors are used, the decisions cannot be made locally. As shown in FIG. 13, if the signal copies are coherent and synchronous, the synchronized signal fusion method will be used. Otherwise as shown conceptually in FIG. 14, the fusion center will conduct post-synchronization to compensate the time, frequency, and phase offsets among signal copies and the asynchronous signal fusion method will be used.

Referring to FIG. 13, in synchronous signal fusion, if it is assumed that the carrier frequencies and timings among signal copies are synchronous in time and frequency and the Doppler effect is negligible, then the received signal at the $l^{th}$ sensor as $$r_l(t,x) = h_l(t) * s(t,x) + n_l(t) \text{ for } l=1, 2, \ldots, L$$

when $s(t,x)$ is the SOI 128, x is a vector of unknown parameters which can be estimated by BSC or SET with well known a priori art, $h_l(t)$ is the channel impulse response including the receiver gain, '*' is the convolution operation, and $n_l(t)$ is AWGN.

The SOI 128 can be received along various channels 1 (194), 2 (196) to a predetermined number L (198) by corresponding slave sensors 1 (200), 2 (202) to the predetermined number L (204). A means for synchronization 205 according to well known a priori art can be employed to provide that the SOI copies 1 (206), 2 (208) to the predetermined number L (210) are synchronous and coherent when transmitted to and received by the master or fusion center 120, 122.

The distributed signal copies, SOI copies 1(206), 2 (208) to L (210), can be combined by finding the best set of filters $g_l(t)$, l=1, 2, ..., L such that the combined signal $$r^c(t, x) = \sum_{l=1}^{L} g_l(t) * [h_l(t) * s(t, x) + n_l(t)]$$

has the maximum performance measurement, such as SNR. The distributed signal copies, SOI copies 1 (206), 2 (208) to L (210), are transmitted to the corresponding filter 1 (212), filter 2 (214) up to the corresponding predetermined filter L (216).

Optimization methods such as maximum ratio combining and beam-forming can be used to calculate $g_l(t)$. For example in the embodiment shown in FIG. 13, the filtered SOI copies 1 (206), 2 (208) to L (210) can be combined in a mixer 218.

If the channel is flat, then $h_l(t)=a_l$, $g_l(t)=g_l$, and $$r^c(t,x) = a^c s(t,x) + n^c(t)$$

where $$a^c = \sum_{l=1}^{L} g_l a_l$$

and $$n^c(t) = \sum_{l=1}^{L} g_l n_l(t)$$

are in complex valuables. Therefore, the combined signal $r^c(t,x)$ is in the form of the input of BSC or SEI. In other words, the unknown x in the combined signal can be resolved by BSC or SEI using well known a prior art. In general, if all phase offsets among signal copies are uniformly distributed in a domain less than 180 degrees, the signal copies, 1 (206), 2 (208) to L (210), will be added constructively when L is sufficiently large. That is, a larger magnitude for the complex number $a^c$ will be obtained compared to the single signal copy case so that the SNR is larger for the combined signal. The smaller the phase offsets, the larger the magnitude of $a^c$, and the larger the number of sensors L, the smaller the combined noise power $n^c(t)$. Hence, the SNR of the combined signal becomes higher which yields the probability of successful classification of x becomes higher. The combined signal $r^c(t, x)$ can be further adjusted by using an adaptive mechanism 220 before sending to BSC or SEI for estimating the unknown parameter vector x in the estimator 222 as shown in FIG. 13. Ultimately a final decision 224 is achieved.

The SNR of the combined signal can be further improved by using the post-synchronization to compensate phase offsets among signal copies 1 (206), 2 (208) to L (210) to achieve the coherent signal combining.

Asynchronous signal fusion can be employed when the distributed signal copies are not coherent and synchronous. In this case, there exist not only the parameter offsets between the transmitting and receiving signals, but also the offsets among all distributed sensors 114, 116 and 118 due to the differences in local oscillators, sampling clocks, channels, Doppler effects, etc.

As was the case with synchronous signal fusion, the SOI 128 can be received along various channels 1 (226), 2 (228) to a predetermined number L (230) by corresponding slave sensors 1 (232), 2 (234) to the predetermined number L (236). The SOI copies 1 (238), 2 (240) to the predetermined number L (242) are synchronous and coherent when transmitted to and received by the master or fusion center 120, 122.

Denoting $\Delta f_l$ as the carrier frequency offset between the $l^{th}$ signal copy and the reference, which can be selected as sensor 1, $\Delta\phi_l$ as the carrier phase offset between the $l^{th}$ signal copy and the reference, and $\Delta\tau_l$ as the carrier frequency offset between the $l^{th}$ signal copy and the reference, the offsets can be compensated with post synchronization 246 in a means for post synchronization within fusion center 120, 122 (without physically synchronizing the sensors or estimating the offsets in sensors locally). Well known a prior art can be used to estimate the offset in an offsets estimator 248 within fusion center 120, 122. A straight forward solution is to find the best estimates of $\Delta f_l$, $\Delta\phi_l$ and $\Delta\eta$ such that $$J(\Delta\hat{f}_l, \Delta\hat{\varphi}_l, \Delta\hat{\tau}_l) = \int_t r_1(t, x) * r_l(t + \Delta\hat{\tau}_l, x) e^{j(2\pi\Delta\hat{f}_l t + \Delta\hat{\varphi}_l)} dt$$

for l=2, 3, ..., L is a maximum. Then, the distributed asynchronous signal copies, 238, 240 and up to 242, can be combined by finding the best filter, namely filter 1 (250), filter 2 (252) and up to a predetermined filter L (254), $g_l(t)$, l=1, 2, ..., L, such that the combined signal $$r^c(t,x) = \sum_{l=1}^{L} g_l(t) * \left[ r_l(t + \Delta \hat{\tau}_l, x) e^{j(2\pi \Delta \hat{f}_l t + \Delta \hat{\varphi}_l)} \right]$$

has the maximum SNR. A coarse estimation may be applied to make the offsets $\Delta f_l$, $\Delta \phi_l$, $\Delta \tau_l$ as small as possible and the fine tuning will be followed to minimize the residual offsets. After post-synchronization 246, the combined signal $r^c(t,x)$ is in a similar form with the one discussed in the synchronous signal fusion case so the same processing will be used with BSC or SEI for estimating in the estimator 222 the unknown parameter vector x as shown in FIG. 14. An adaptive mechanism 220 can be employed to adjust $g_l(t)$, l=1, 2, . . . , L, to maximize the processing gain.

The goal of combining the distributed local signal copies is to enhance the SNR. Under the ideal conditions, the processing gain of L will be achieved. Although the raw signal fusion occupies more transmission bandwidth compared with the decision fusion method, the former provides faithful local information without compression so that the fusion performance is better. It is remarkable that only a very short signal snapshot is collected in the local sensors 114, 116 and 118 and transmitted to the fusion center 120, 122 and the probability $P(r^l|H_i)$ used in the decision fusion is not needed in this approach.

Figure 16:
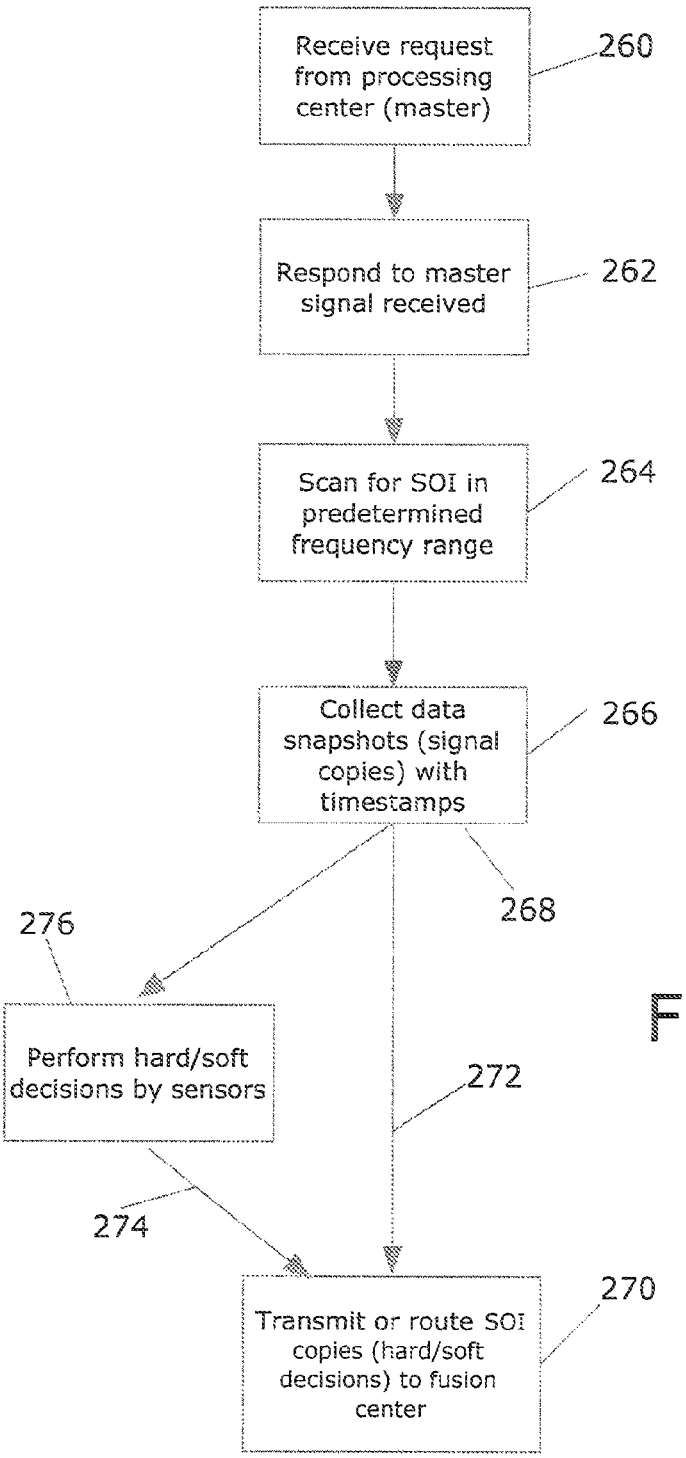
FIG. 16 is a flowchart depicting the operation steps of the multi-distributed sensors either individually or in clusters according to a preferred method in accordance with the present invention.
Figure 17:
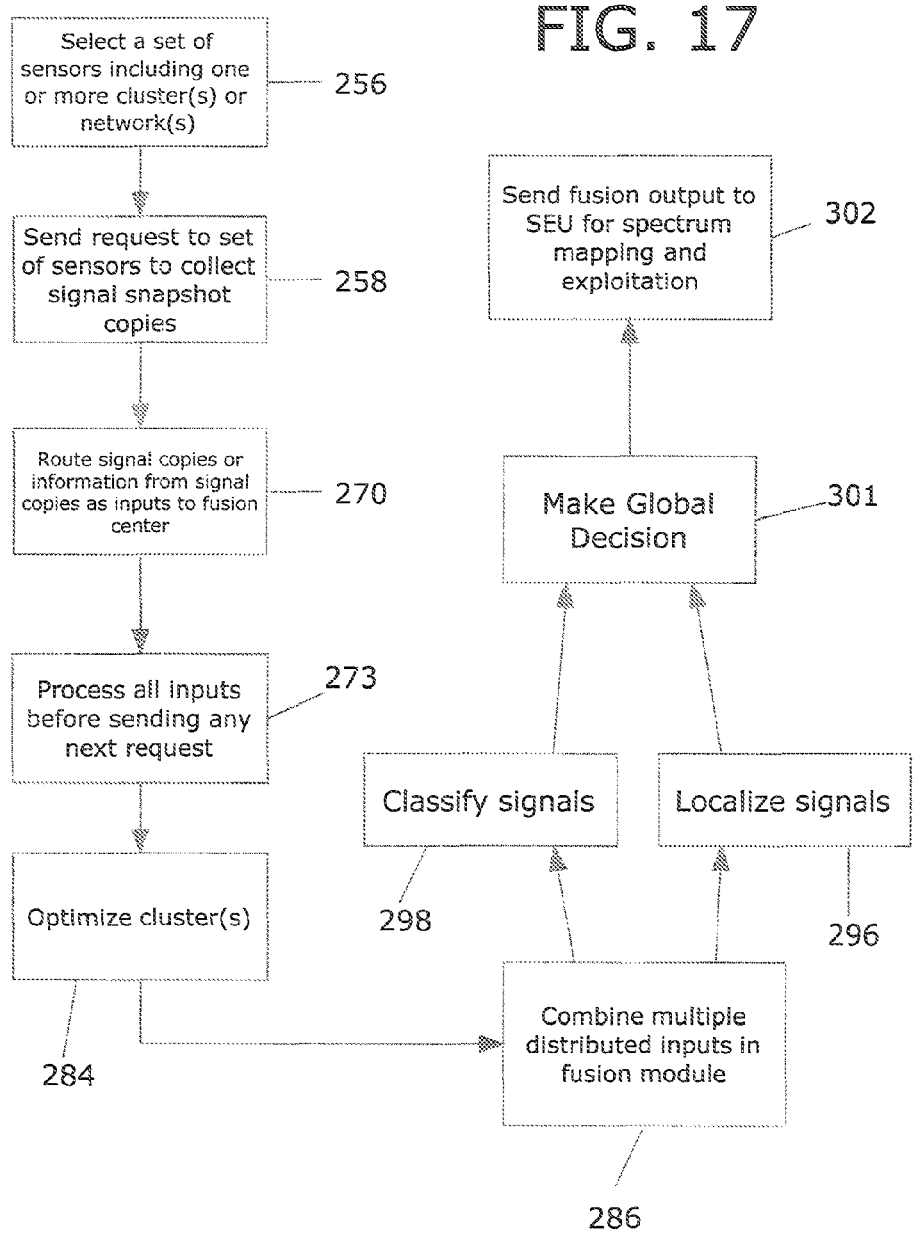
FIG. 17 is a flowchart depicting the operation steps of the fusion center and SEU and data storage in communicating with the multi-distributed sensors either individually or in clusters and processing the signals routed or transmitted from the multi-distributed sensors according to a preferred method in accordance with the present invention.

The operation process and components for the fusion methods is shown in FIG. 15 and also the flow charts of FIGS. 16 and 17. The fusion or processing center (master) 120, 122 chooses or selects (256) an initial cluster 130, 132 of sensors (slaves) 114, 116, 118 distributed around the SOI 128 and broadcasts a request (258) to the sensors 114, 116, 118 for collecting (258) a snapshot of the SOI 128.

Available sensors 114, 116, 118, as shown in FIGS. 15 and 16, receive (260) the request (258) from the fusion sensor 120, 122 along channel 261, respond (262) along channel 272 to the master request (258) and scan (264) the SOI 128 in the given frequency range. After finding the SOI 128, the sensors 114, 116, 118 collect (266) a short timeframe of data snapshots (signal copies) in distributed locations with timestamps 268.

The snapshots of local signal copies or the information obtained from local signal copies can be routed or transmitted 270 via channel 272 directly to the fusion center 120, 122 as time stamped 268 packets through the existing communication network 112 so the order of the packets is not important and multiple receiving channels in the fusion center 120, 122 are not necessary. The fusion center 120, 122 processes (273) all inputs before sending the next request (258). The inputs can be delivered either as the raw analytic signal samples along channel 272 or they can be routed or transmitted via channel 274 after hard/soft decisions 276 are made locally by the sensors 114, 116, 118.

The fusion center 120, 122, processing all inputs (273), can perform various functions in a coarse signal estimation module 278 for coarse signal classification, in a channel analysis unit 280 for coarse channel analysis, in an emitter localization module 282 for coarse emitter localization. The fusion center 120, 122 in an optimal clustering module 286 can optimize the cluster or clusters to minimize interference, channel distortion, and multiple users, and maximize the signal to noise ratio. Well known a priori art can be used for optimizing the cluster.

The fusion center 120, 122 combines (286) the multiple distributed inputs 288 in a fusion module 290 to yield a single output along routes 292 and 294 for signal exploitation. If the inputs 288 are local hard/soft decisions, a hard/soft decision fusion method can be used and the output will be the global decision of the signal estimation. If the inputs are raw data of synchronous signal copies, the synchronous signal fusion method can be used to form a combined signal. If the inputs 288 before fusion module 290 are raw data of asynchronous signal copies, asynchronous raw signal fusion method can be applied to yield a combined signal. The fusion output for the combined signal is a decision which is a group of parameters and signal format related to spectrum, modulation, and other desired signal parameters and identities. If the inputs are a mix of raw data and decisions, both raw signal and decision fusion methods will be used appropriately to calculate the meta-global decision.

The fusion center 120, 122 can pass the multiple signal copies to an emitter localization module 296. Many a priori art techniques can be applied such as Received-Signal-Strength-Difference, Time-of-Arrival, Angle-of-Arrival, Time-Difference of Arrival, Frequency-Difference of Arrival, etc to determine the localization of the signals. The goal of distributed emitter localization is to average the localization results provided by local sensors 114, 116, 118 in order to minimized the localization error. Therefore, low-cost and low-accurate sensors 114, 116, 118 can be used. The multiple signal copies can also be sent along channel 292 to a classification module 298 which provides for determining at least the modulation methods used for the signals.

After the signals are classified and localized, they can be sent to a decision module 300 in which a global decision can be made (301) concerning the signals.

The global decision can be outputted 302 from the fusion center 120, 122 to the SEU 124 to a spectrum mapping module 158 for spectrum mapping and to an exploitation module 160 for spectrum monitoring and regulation. The spectrum map is used for spectrum monitoring such as detecting unused spectrum, identifying primary users, classifying adversaries, detecting interferences, etc.

The various processing results from the fusion center 120, 122 can be routed or transmitted along channel 304 for storage in data storage module 126. Also the processing results from the SEU 124 can be routed or transmitted along channel 304 for storage in data storage module 126. Signal information from the SEU 124 can also be routed or transmitted along channel 308 to the distributed sensors 114, 116, 118 to provide updated instructions for operation and optimizing the communication network 112.

Multiple fusion centers 120, 122 may be used for a massively or multi-distributed sensor network to form a system of systems for spectrum exploitation. The global decisions from the fusion centers can be further fused to form a meta-global decision. As shown for example in FIG. 9, the sensor network can include one or more individual single sensors 114 together with at least one cluster either 130 or 132 and their corresponding sensors 116 and 118, respectively. In the case of the sensor network of one or more individual sensors 114 and cluster 130, the sensors 116 transmit or route their signals to fusion center 120 which receives signals from sensors 116 within cluster 130. The one or more single sensors 114 can also route or transmit their signals to fusion center 120 which is included in the cluster 130. Then fusion center 120 can communicate with the SEU 124.

In an alternative embodiment, one or more individual single sensors 114 can be combined with cluster 132. In this instance, all sensors 118 of cluster 132 route or transmit their signals, and sensor 114 transmit its local decision to fusion center 122 which is outside of cluster 132. Fusion center in turn communicates with SEU 124.

In yet another alternative embodiment, one or more individual single sensors 114 can be combined with both clusters 130 and 132 in the arrangement as shown in FIG. 9. In this instance, the sensors 116 of cluster 130 route or transmit their signals to fusion center 120 which the sensors 118 of cluster 132 route or transmit their signals to fusion center 122. The one or more individual sensors 114 can route or transmit their signals to either fusion center 120 or fusion center 122. Fusion centers 120 and 122 can each communicate with SEU 124.

Other preferred alternative embodiments employing additional combinations of cluster types 130 and 132 with or without one or more individual single sensors 114 can be employed.

Figure 18:
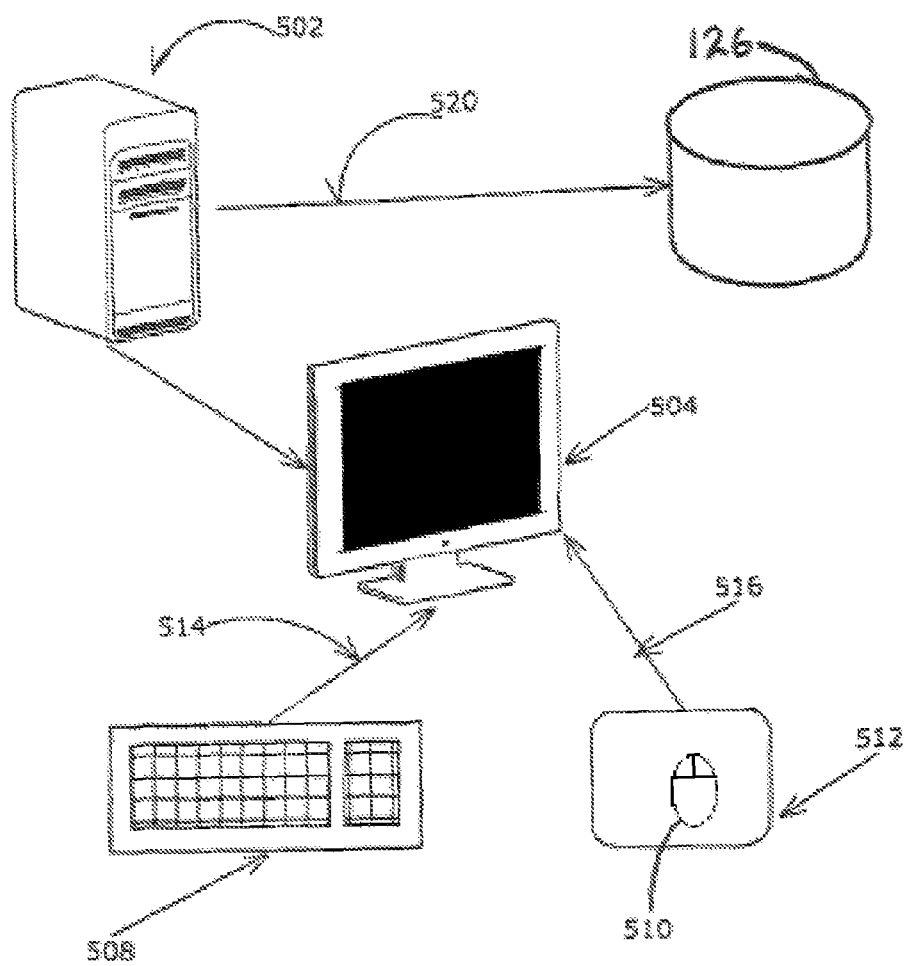
FIG. 18 is a diagrammatic chart of a computer network that can be used to practice a preferred method of the present invention together with the data storage module.

Referring to FIG. 18, there is shown a diagrammatic chart of a computer network for use in an alternative embodiment of the present invention.

The following is a glossary of terms used or applicable in this application with respect to the present invention.

Storage Memory—Any of various types of memory devices or storage devices that are computer readable. The term "storage memory" is intended to include an installation medium, e.g., a CD, DVD, floppy disks, or tape device, a computer system memory or random access memory such as DRAM, DDR RAM, SRAM, EOO RAM, Rambus RAM, etc.; or a non-volatile memory such as a magnetic media, e.g., a hard drive, or optical storage. The storage memory may comprise other types of memory as well, or combinations thereof. Other examples of storage medium include thumb drives and memory sticks. In addition, the storage memory may be located in a first computer in which the programs are executed, or may be located in a second different computer which connects to the first computer over a network, such as an Intranet or Internet. In the latter instance, the second computer may provide program instructions to the first computer for execution. The term "storage memory" may include two or more memory mediums which may reside in different locations, e.g., in different computers or other electronic devices such as for example, without limitation, cellphones, smartphones, tablets or pads that are connected over a network.

Programmable Hardware Element—includes various types of programmable hardware, reconfigurable hardware, programmable logic, or field-programmable devices (FPDs), such as one or more FPGAs (Field Programmable Gate Arrays), or one or more PLDs (programmable Logic Devices), such as one or more Simple PLDs (SPLDs) or one or more Complex PLDs (CPLDs), or other types of programmable hardware. A programmable hardware element may also be referred to as "reconfigurable logic".

Program—the term "program" is intended to have the full breadth of its ordinary meaning. The term "program" includes a software program which may be stored in a memory and is executable by a processor or a hardware configuration program useable for configuring a programmable hardware element.

Software Program—the term "software program" is intended to have the full breadth of its ordinary meaning, and includes any type of program instructions, code, script and/or data, or combinations thereof, that may be stored in a computer readable storage memory or a programmable hardware element and which program instructions, code, script and/or data, or combinations thereof, can be executed by a processor or microprocessor. Exemplary software programs include programs written in text-based programming languages, such as C, C++, Pascal, Fortran, Cobol, Java, assembly language, etc.; graphical programs (programs written in graphical programming languages); assembly language programs; programs that have been compiled to machine language; scripts; and other types of executable software. A software program may comprise two or more software programs that interoperate with one another.

Graphical User Interface—this term is intended to have the full breadth of its ordinary meaning. The term "Graphical User Interface" is often abbreviated to "GUI". A GUI may comprise only one or more input GUI elements, only one or more output GUI elements, or both input and output GUI elements.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) or components and including without limitation, cellphones, smartphones, tablets or pads, and which have at least one processor that executes instructions from a storage memory.

Referring to FIG. 18, a computer system 500 is shown that can be used to practice the method of the present invention. In one embodiment, the computer system 500 can include a desktop tower 502 that contains a microprocessor or central processor unit (CPU), random access memory RAM and a hard disk drive HDD for storing and/or operating application programs or data for use with the programs. A display 504 such as a liquid crystal display LCD is coupled to the desktop tower 502 as represented by line 506. A keyboard 508 and a mouse 510 on mouse pad 512 are coupled to the display 504 as represented by lines 514 and 516, respectively. Also according to a preferred embodiment, the data storage 126 is shown coupled to the computer system 500. The coupling lines can include cables or wireless connections including network hookups.

Each of the sensors 114, 116 and 118 as well as the fusion center 120, 122 and the SEU 124 have storage memory which is also found in the data storage 126. Hence each of these components is capable of storing programs for operation of the method of the present invention. In addition, each of these components can have a programmable hardware element which can also store operational programs or portions thereof. Storage memory is also disposed within the desktop 502 which can be replaced with a laptop (not shown) or other computing component which has a processor. Access to the operational programs is provided by use of the keyboard 508 and/or mouse 510 and the LCD 504 or other display to show the operational status of the network 112. In one preferred embodiment, a GUI is provided on the LCD 504 to allow for graphical and/or touch screen operation on the display. The spectrum mapping 158 and spectrum monitoring and regulation 160 results can be stored in data storage module 126 and also be displayed on the LCD. If desired, the display can indicate the various operational states of the method of the present invention. In one example, the display can illustrate which sensors or clusters are employed during operation of the method of this invention. The display can also illustrate the results of the coarse channel analysis 300, the coarse signal classification 278, the coarse emitter localization 282 and the optimal clustering 284. Moreover, the results of the classification 298 and localization 296 can be displayed as well as the various parameters of the decision 300.

Operational programs or portions thereof containing computer readable instructions for implementing the methods of the present invention can be stored, according to alternative preferred embodiments, in data storage module 126, in the storage memory in desktop 502 and also in storage memory in the sensors 114, 116 and 118 and in the storage memory in fusion centers 120 and 122.

In the computer system implemented embodiment of the present invention shown in FIG. 18, although only one computer system 500 is shown, the present invention contemplates that a plurality of such systems 500 can be coupled to the data storage 126 either by wire or via the Internet according to well know methods.

In the embodiment employing several computer systems 500, they can be connected via a local area network (LAN) or a wide area network (WAN). Alternatively, one or more of the computers of system 500 can be coupled through wireless capabilities such as WiFi or Bluetooth. Each of the computer systems 500 can have its own storage memory medium for storing computer readable instructions that when executed by their respective computer processors can provide information on the display and/or provide a graphical user interface (GUI) to aid in the operability of the program or programs stored on the storage memory.

It is to be further understood that other features and modifications to the foregoing detailed description are within the contemplation of the present invention, which is not limited by this detailed description. Those skilled in the art will readily appreciate that any number of configurations of the present invention and numerous modifications and combinations of materials, components, arrangements and dimensions can achieve the results described herein, without departing from the spirit and scope of this invention. Accordingly, the present invention should not be limited by the foregoing description, but only by the appended claims.

What I claim is:

1. A distributed multi-sensor system for spectrum mapping and signal exploitation, comprising:
    a plurality of distributed sensors comprising a first set of sensors distributed in a first region and said first set of sensors configured to receive a plurality of non-cooperative non coherent and asynchronous signals, s(t), from an unknown transmission source of interest (SOI), each of said sensors of said first set having a sampling clock and a local memory, and providing a first set of receive signals, and said plurality of distributed sensors further comprising a second set of sensors including a cluster of sensors distributed in a second region and said second set of sensors configured to receive the plurality of non-cooperative non coherent and asynchronous signals, s(t), from the unknown transmission source (SOI), each of said cluster of sensors of said second set having a sampling clock and a local memory, and providing a plurality of received signals;
    said plurality of distributed sensors being configured to collect timestamped data snapshots of the SOI;
    a first fusion center disposed in said first region and being configured to receive timestamped signals from said first set of sensors;
    a second fusion center disposed outside of said first region of distributed sensors and said second region of distributed sensors and being configured to receive timestamped signals from said second set of sensors and at least one of the received signals and information from said first fusion center;
    said second fusion center further configured to process all signal inputs before sending any next request to said plurality of sensors and to optimize said plurality of sensors;
    said second fusion center further configured to combine the distributed signal inputs from said plurality of sensors; and
    said first fusion center, said second fusion center or a combination thereof further configured to make a global decision concerning said sensor signals.

2. The distributed multi-sensor system of claim 1 further comprising a signal exploitation unit (SEU) for spectrum mapping and exploitation and means for sending the global decision as output from second fusion module to said SEU.

3. The distributed multi-sensor system of claim 1 further comprising means disposed in said second fusion center for localizing said combined multiple distributed signal inputs before making a global decision.

4. The distributed multi-sensor system of claim 1 further comprising means disposed in said second fusion center for classifying said combined multiple distributed signal inputs before making a global decision.

5. The distributed multi-sensor system of claim 1 further comprising means disposed in said second fusion center for providing at least one of coarse channel analysis, coarse signal classification and coarse emitter localization before optimizing said plurality of distributed sensors.

6. The distributed multi-sensor system of claim 1 further comprising a data storage module coupled to said second fusion module for storing results obtained by said second fusion module.

7. The distributed multi-sensor system of claim 1 wherein said plurality of distributed sensors comprises at least one of thin sensors and thick sensors.

8. The distributed multi-sensor system of claim 1 wherein said fusion centers provide at least one of hard and soft decisions.

9. The distributed multi-sensor system of claim 1 further comprising a data storage module coupled to said SEU for storing information from said SEU.

10. The distributed multi-sensor system of claim 1 further comprising a data storage module coupled to said distributed sensors for storing information from said distributed sensors.

11. A system, comprising:
    a first fusion center configured to receive a first signal set from a first set of sensors that represent a signal set, process the first signal set before sending a next request to the first set of sensors and combine individual signals from the first signal set to form a first combined signal; and
    a second fusion center configured to receive a second signal set from a second set of sensors that represent the signal set, process the second signal set before sending a next request to the second set of sensors and combine individual signals from the second signal set to form a second combined signal,
    wherein the first combined signal is combined with the second combined signal to produce an ultimate combined signal,
    wherein the ultimate combined signal is used to produce a global decision,
    wherein the first signal set is produced from the first set of sensors distributed in a first region,
    wherein the first signal set is timestamped when received by the first fusion center,
    wherein the first signal set is timestamped in accordance with a sampling clock of the first set of sensors,
    wherein the first signal set is, when received by the first fusion center, multiple non-cooperative, non-coherent and asynchronous signals from an unknown transmission source of interest, wherein the second signal set is produced from a second set of sensors distributed in a second region, wherein the second signal set is timestamped when received by the second fusion center, where the second signal set is timestamped in accordance with a sampling clock of the second set of sensors, and wherein the second signal set is, when received by the second fusion center, multiple non-cooperative, non-coherent and asynchronous signals from the unknown transmission source of interest.

12. The system of claim 11, wherein:
the first fusion center is disposed in a first region,
the second fusion center is disposed outside the first region, and
the second fusion center is disposed outside the second region.

13. The system of claim 11, wherein the global decision is enacted.

14. The system of claim 11, wherein:
the first fusion center submits an initial request to the first set of sensors for the first signal set,
the first signal set is sent from the first set of sensors in response to the initial request to the first set of sensors,
the initial request to the first set of sensors is sent before the next request to the first set of sensors,
the second fusion center submits an initial request to the second set of sensors for the second signal set,
the second signal set is sent from the second set of sensors in response to the initial request to the second set of sensors,
the initial request to the second set of sensors is sent before the next request to the second set of sensors.

15. The system of claim 11, wherein the ultimate combined signal is classified prior to production of the global decision.

16. The system of claim 11, wherein:
the global decision is sent to a signal exploitation unit,
the signal exploitation unit spectrum maps the global decision, and
the signal exploitation unit exploits the global decision.

17. A non-transitory computer-readable medium configured to store computer-executable instructions that when executed by a processor cause the processor to perform a method, the method comprising:
receiving a first signal set, from a first set of sensors distributed in a first region, that represent a signal of interest, wherein the first signal set at reception includes timestamp information produced in accordance with a sampling clock of the first set of sensors;
processing the first signal set, wherein the first signal set is produced from the first set of sensors distributed in a first region;
combining individual signals from the first signal set to form a first combined signal, wherein the individual signals from the first signal set are non-cooperative, non-coherent and asynchronous signals from an unknown transmission source of interest;
sending a next request to the first set of sensors for a first subsequent signal set after processing the first signal set;
receiving a second signal set from a second set of sensors that represent the signal of interest, wherein the second signal set at reception includes timestamp information produced in accordance with a sampling clock of the second set of sensors;
processing the second signal set, wherein the second signal set is produced from the second set of sensors distributed in a second region;
combining individual signals from the second signal set to form a second combined signal, wherein the individual signals from the second signal set are non-cooperative, non-coherent and asynchronous signals from the unknown transmission source of interest;
sending a next request to the first set of sensors for a second subsequent signal set after processing the second signal set;
combining the first combined signal with the second combined signal to produce a total signal; and
making a global decision based, at least in part, on content of the total signal.

18. The non-transitory computer-readable medium of claim 17, the method comprising facilitating implementation of the global decision.

19. The non-transitory computer-readable medium of claim 17 being disposed in a fusion center.

20. The non-transitory computer-readable medium of claim 17, wherein a classification of the global signal is determined and where the classification is used in making the global decision.

* * * * *